(12) United States Patent
Kim et al.

(10) Patent No.: US 12,106,942 B2
(45) Date of Patent: Oct. 1, 2024

(54) PLASMA PROCESSING APPARATUS AND METHOD FOR DECHUCKING WAFER IN THE PLASMA PROCESSING APPARATUS

(71) Applicant: Samsung Electronics Co., Ltd., Suwon-si (KR)

(72) Inventors: Yi Rop Kim, Hwaseong-si (KR); Kui Hyun Yoon, Yongin-si (KR); Yun Hwan Kim, Hwaseong-si (KR); Moon Eon Lee, Yongin-si (KR); Seok Woo Lee, Changwon-si (KR); Dong Hee Han, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 187 days.

(21) Appl. No.: 17/212,666

(22) Filed: Mar. 25, 2021

(65) Prior Publication Data
US 2022/0068616 A1 Mar. 3, 2022

(30) Foreign Application Priority Data
Aug. 27, 2020 (KR) .................. 10-2020-0108456

(51) Int. Cl.
*H01J 37/32* (2006.01)
*C23C 16/455* (2006.01)
(Continued)

(52) U.S. Cl.
CPC .... *H01J 37/32642* (2013.01); *C23C 16/4586* (2013.01); *H01J 37/32697* (2013.01);
(Continued)

(58) Field of Classification Search
CPC ........... H01J 37/32082; H01J 37/32532; H01J 37/32568; H01J 37/32642;
(Continued)

(56) References Cited

U.S. PATENT DOCUMENTS 4,384,918 A * 5/1983 Abe ................. C23C 14/50
204/298.31
5,452,177 A * 9/1995 Frutiger ............. H02N 13/00
279/128
(Continued)

FOREIGN PATENT DOCUMENTS

JP 2020021866 A 2/2020

*Primary Examiner* — Kurt Sweely
*Assistant Examiner* — Joshua Reyes
(74) *Attorney, Agent, or Firm* — Muir Patent Law, PLLC

(57) ABSTRACT

A plasma process apparatus includes a chamber in which a plasma process is performed, an electrostatic chuck which supports a wafer inside the chamber and comprises a first portion and a second portion disposed on the first portion, a first electrode disposed inside the electrostatic chuck, a second electrode which is spaced apart from the first electrode inside the electrostatic chuck, surrounds the first electrode in a plane defined by the first direction and a second direction perpendicular to the first direction, and is disposed on the same plane as the first electrode, a power supply configured to apply a voltage to each of the first electrode and the second electrode, a plurality of cooling gas supply lines which penetrates the electrostatic chuck in a third direction perpendicular to the first and second directions and is configured to provide a cooling gas to the wafer.

20 Claims, 24 Drawing Sheets

(51) Int. Cl.
*C23C 16/458* (2006.01)
*C23C 16/46* (2006.01)
*H01L 21/67* (2006.01)
*H01L 21/683* (2006.01)
*H01L 21/687* (2006.01)

(52) U.S. Cl.
CPC .. *H01J 37/32724* (2013.01); *H01L 21/68785* (2013.01); *C23C 16/45565* (2013.01); *C23C 16/466* (2013.01); *H01J 37/32091* (2013.01); *H01J 37/32183* (2013.01); *H01L 21/67069* (2013.01); *H01L 21/6831* (2013.01); *H01L 21/6833* (2013.01)

(58) Field of Classification Search
CPC ........... H01J 37/32697; H01J 37/32715; H01J 37/32724; H01J 2237/334; H01J 37/32091; H01J 37/32183; C23C 16/227; C23C 16/236; C23C 16/245; C23C 16/4586; C23C 16/45565; C23C 16/466; H01L 21/6831; H01L 21/6833; H01L 21/67063; H01L 21/67069; H01L 21/67075; H01L 21/68785
See application file for complete search history.

(56) References Cited

U.S. PATENT DOCUMENTS

| | | | |
|---|---|---|---|
| 5,645,921 A * | 7/1997 | Matsunaga | H01L 21/6833 428/209 |
| 5,822,171 A | 10/1998 | Shamouilian et al. | |
| 6,088,213 A * | 7/2000 | Herchen | C23C 16/4586 257/714 |
| 6,310,755 B1 * | 10/2001 | Kholodenko | C04B 35/565 361/115 |
| 6,723,202 B2 | 4/2004 | Nagaiwa et al. | |
| 7,160,392 B2 | 1/2007 | Shang et al. | |
| 8,298,371 B2 | 10/2012 | Koshimizu et al. | |
| 8,454,027 B2 | 6/2013 | Povolny et al. | |
| 10,566,175 B2 | 2/2020 | Nagayama et al. | |
| 2004/0261946 A1 | 12/2004 | Endoh et al. | |
| 2006/0144516 A1 * | 7/2006 | Ricci | H01L 21/6831 156/345.52 |
| 2008/0073032 A1 | 3/2008 | Koshiishi et al. | |
| 2008/0236746 A1 * | 10/2008 | Oyabu | H01J 37/32642 156/345.23 |
| 2008/0239691 A1 * | 10/2008 | Miyagawa | H01L 21/67103 165/185 |
| 2011/0315318 A1 * | 12/2011 | Kobayashi | H01J 37/3244 427/180 |
| 2012/0037597 A1 * | 2/2012 | Koshimizu | H01J 37/32697 156/345.43 |
| 2012/0247954 A1 * | 10/2012 | Yamawaku | H01J 37/32091 204/298.31 |
| 2013/0003249 A1 * | 1/2013 | Lee | H01J 37/32715 361/234 |
| 2014/0146434 A1 * | 5/2014 | Uchida | H01J 37/32715 361/234 |
| 2015/0114567 A1 * | 4/2015 | Nagayama | H01J 37/32091 156/345.52 |
| 2015/0179492 A1 * | 6/2015 | Sasaki | H01J 37/32642 361/234 |
| 2016/0042926 A1 * | 2/2016 | Ishikawa | H01J 37/32522 118/723 R |
| 2018/0286642 A1 * | 10/2018 | Matyushkin | H01L 21/67253 |
| 2019/0088512 A1 * | 3/2019 | Zucker | C23C 16/4586 |
| 2019/0172687 A1 * | 6/2019 | Ikari | H01J 37/32605 |

\* cited by examiner

PLASMA PROCESSING APPARATUS AND METHOD FOR DECHUCKING WAFER IN THE PLASMA PROCESSING APPARATUS

This application claims priority under 35 U.S.C. 119 to Korean Patent Application No. 10-2020-0108456 filed on Aug. 27, 2020 in the Korean Intellectual Property Office, the disclosure of which in its entirety is herein incorporated by reference.

BACKGROUND

1. Technical Field

The present disclosure relates to a plasma process apparatus and a method for dechucking a wafer in the plasma process apparatus.

2. Description of the Related Art

Degree of process difficulty increases as the process progresses to the next generation, and especially, a CMC process requires a higher wafer temperature to increase a selection ratio than before. However, a phenomenon in which dechucking of the wafer is not performed normally after the process and the wafer cracks when lifting occurs. This phenomenon is interpreted to occur due to the fact that the temperature of a ceramic plate rises compared to the existing conditions when using the conditions of the next-generation CMC process, which strengthens the residual adsorption force. This may occur because, as the temperature of the ceramic plate rises, its specific resistance decreases and thus, the Johnson-Rahbek Effect is revealed. In order to alleviate this, addition and adjustment of dechucking staffs of various wafers may be used. However, this can result in the time required for dechucking of the wafer increasing to the level of about 350 seconds, which is considered to have a significant adverse effect on productivity.

SUMMARY

Aspects of the present disclosure provide a plasma process apparatus in which a junction portion including a ductile material is formed between a focus ring and an electrostatic chuck to improve a heat transfer efficiency.

Aspects of the present disclosure also provide a plasma process apparatus in which the task time required for removing a focus ring is reduced by forming a junction portion including a material having low adhesiveness between the focus ring and the electrostatic chuck to improve the efficiency of the process.

Aspects of the present disclosure also provide a plasma process apparatus in which a junction portion having excellent heat resistance is formed between the focus ring and the electrostatic chuck to improve the joining reliability of the focus ring in a high-temperature plasma process.

Aspects of the present disclosure also provide a plasma process apparatus in which a wafer is prevented from being damaged in a process of dechucking the wafer, by forming a plurality of electrodes spaced apart from each other inside an electrostatic chuck and by controlling each electrode independently.

Aspects of the present disclosure also provide a method for dechucking a wafer in a plasma process apparatus in which the wafer is prevented from being damaged in a process of dechucking the wafer, by forming a plurality of electrodes spaced apart from each other inside an electrostatic chuck and by controlling each electrode independently.

According to an exemplary embodiment of the present disclosure, there is provided a plasma process apparatus, comprising a chamber in which a plasma process is performed, an electrostatic chuck which supports a wafer inside the chamber and comprises a first portion and a second portion disposed on the first portion, a width of the first portion in a first direction being greater than a width of the second portion in the first direction, a first electrode disposed inside the electrostatic chuck, a second electrode which is spaced apart from the first electrode inside the electrostatic chuck, surrounds the first electrode in a plane defined by the first direction and a second direction perpendicular to the first direction, and is disposed on the same plane as the first electrode, a power supply configured to apply a voltage to each of the first electrode and the second electrode, a plurality of cooling gas supply lines which penetrates the electrostatic chuck in a third direction perpendicular to the first and second directions and is configured to provide a cooling gas to the wafer, a focus ring which surrounds side walls of the second portion of the electrostatic chuck and at least partially overlaps the first portion of the electrostatic chuck in the third direction, and a junction portion disposed between the first portion of the electrostatic chuck and the focus ring.

According to an exemplary embodiment of the present disclosure, there is provided a plasma process apparatus, comprising a chamber in which a plasma process is performed, an electrostatic chuck which supports a wafer inside the chamber and comprises a first portion and a second portion disposed on the first portion, a width of the first portion in a first direction being greater than a width of the second portion in the first direction, first and second electrodes disposed apart from each other inside the second portion of the electrostatic chuck, a focus ring which surrounds side walls of the second portion of the electrostatic chuck and at least partially overlaps the first portion of the electrostatic chuck in a vertical direction, and a junction portion disposed between the first portion of the electrostatic chuck and the focus ring, and comprising a first layer and a second layer disposed on the first layer, the second layer including a metal, wherein a first thickness of the first layer in the vertical direction is 60 µm to 350 µm, and a second thickness of the second layer in the vertical direction is 30 µm to 70 µm.

According to an exemplary embodiment of the present disclosure, there is provided a method for dechucking a wafer in a plasma process apparatus, comprising loading the wafer onto an electrostatic chuck disposed inside a chamber, performing a plasma process on the wafer, cutting off a power supply of a second electrode disposed at an edge portion of the electrostatic chuck, dechucking an edge portion of the wafer located on the second electrode, cutting off the power supply of a first electrode disposed at a central portion of the electrostatic chuck and spaced apart from the second electrode, and dechucking a central portion of the wafer located on the first electrode.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof referring to the attached drawings, in which.

DETAILED DESCRIPTION OF THE EMBODIMENTS

Hereinafter, a plasma process apparatus according to some embodiments of the present disclosure will be explained referring to FIGS. 1 to 5.

Figure 1:
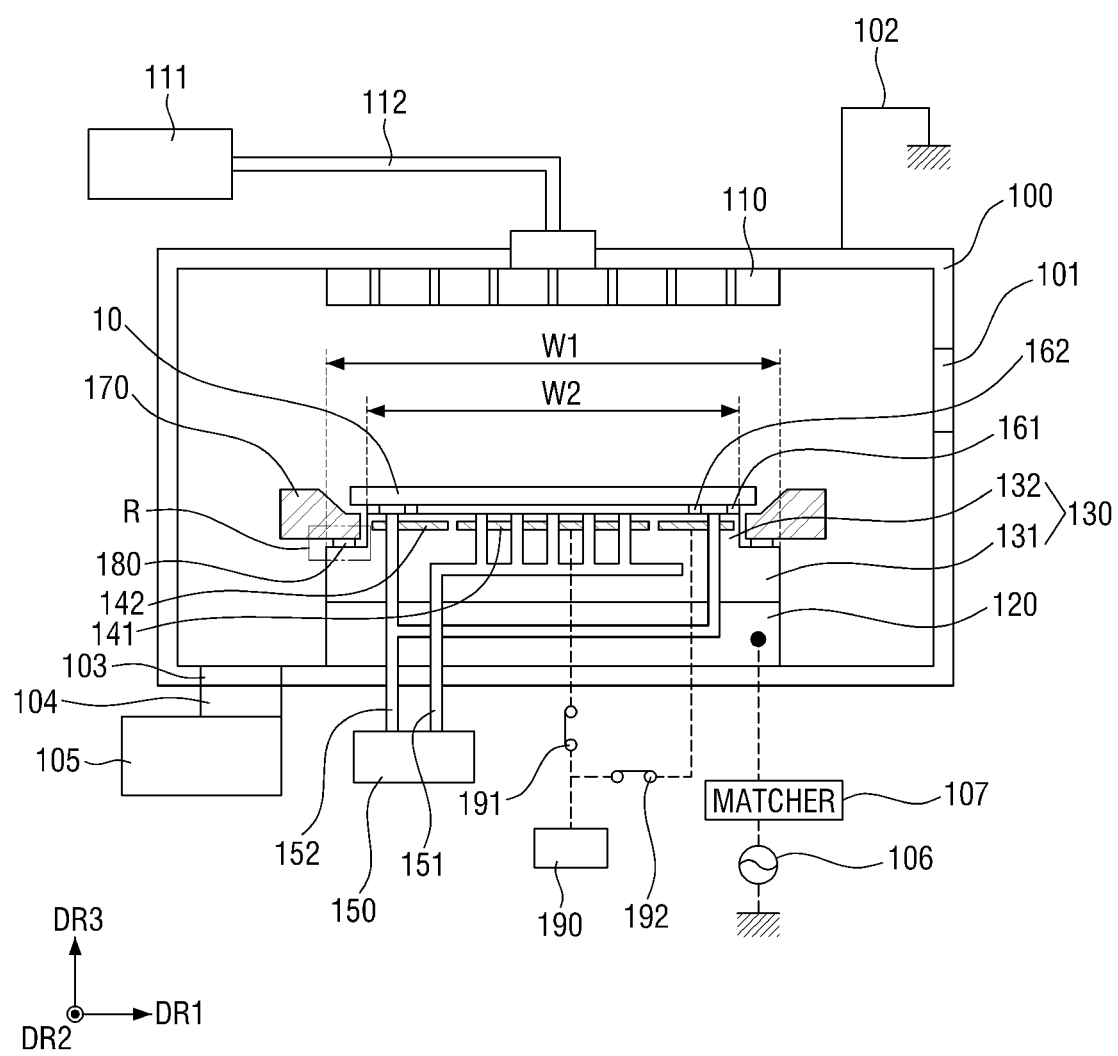
FIG. 1 is a diagram for explaining a plasma process apparatus according to some embodiments of the present disclosure.
Figure 2:
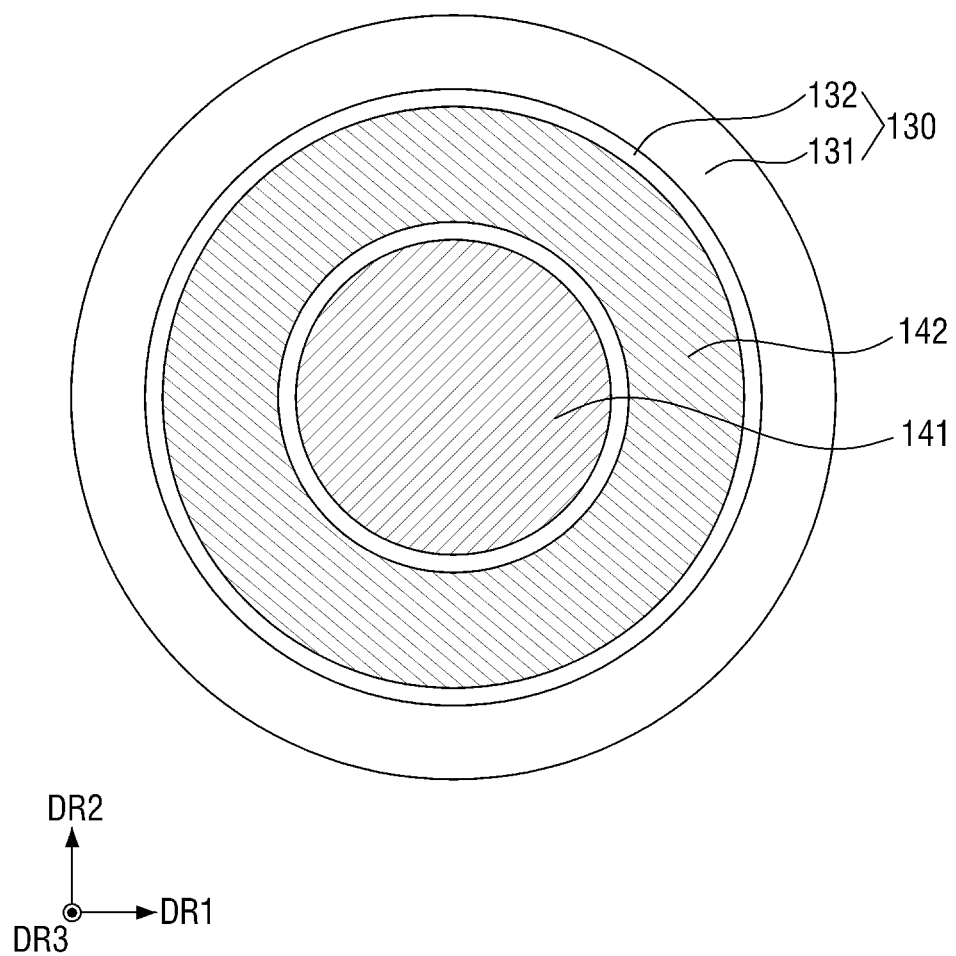
FIG. 2 is a plan view for explaining a first electrode and a second electrode shown in FIG. 1 according to example embodiments.
Figure 3:
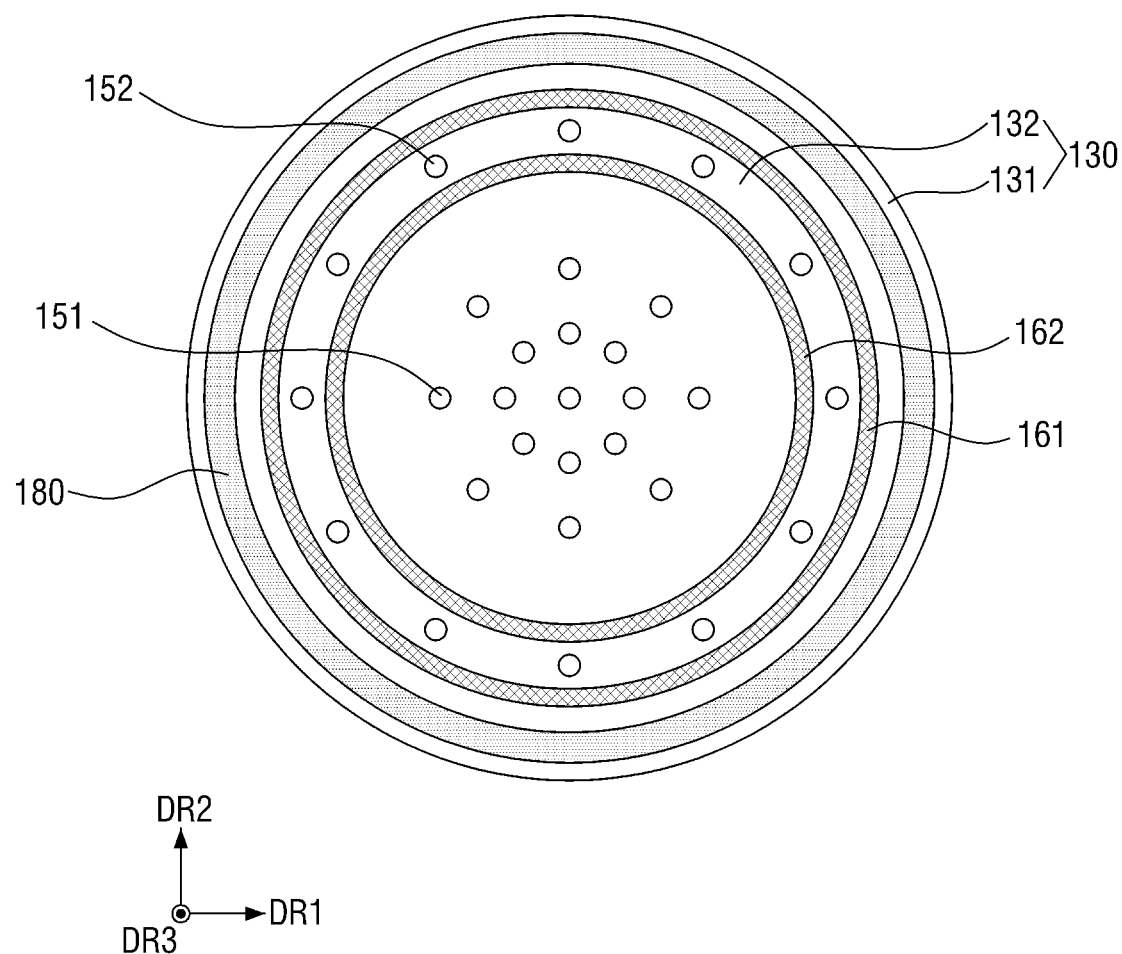
FIG. 3 is a plan view for explaining an upper part of an electrostatic chuck shown in FIG. 1 according to example embodiments.
Figure 4:
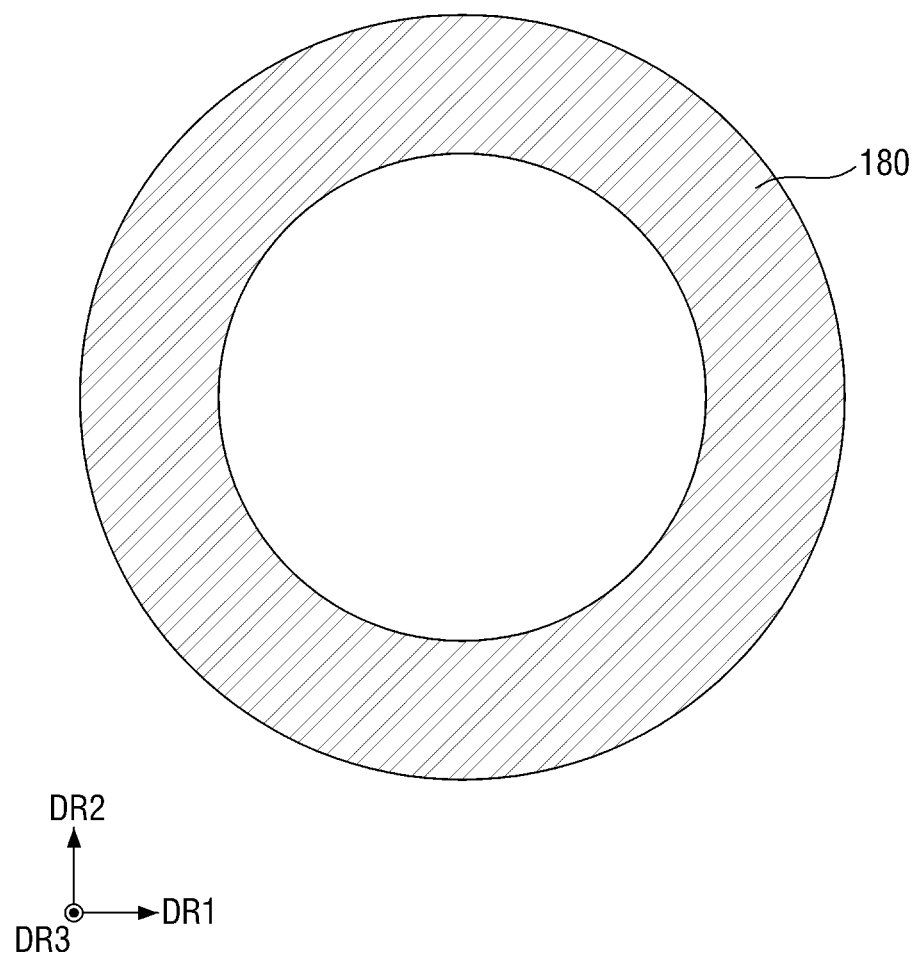
FIG. 4 is a plan view for explaining a focus ring shown in FIG. 1 according to example embodiments.
Figure 5:
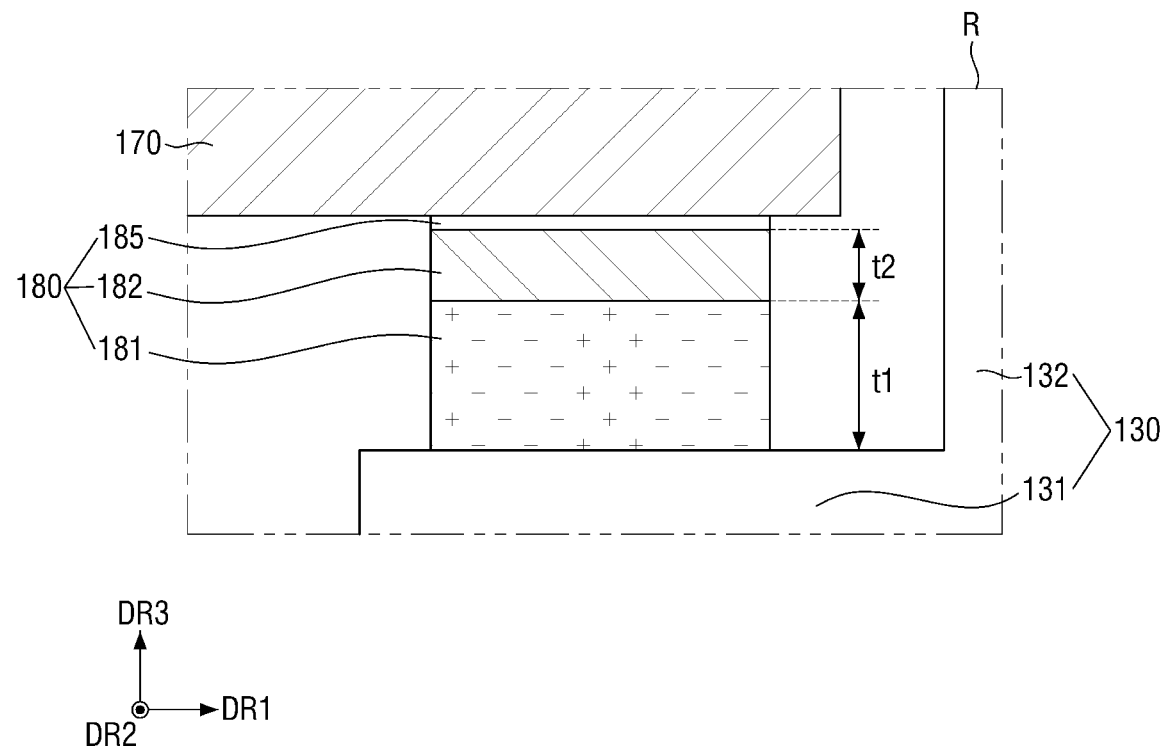
FIG. 5 is an enlarged view of a region R of FIG. 1 according to example embodiments.

FIG. 1 is a diagram for explaining the plasma process apparatus according to some embodiments of the present disclosure. FIG. 2 is a plan view for explaining a first electrode and a second electrode shown in FIG. 1 according to example embodiments. FIG. 3 is a plan view for explaining an upper part of the electrostatic chuck shown in FIG. 1 according to example embodiments. FIG. 4 is a plan view for explaining a focus ring shown in FIG. 1 according to example embodiments. FIG. 5 is an enlarged view of a region R of FIG. 1 according to example embodiments.

Referring to FIGS. 1 to 5, the plasma process apparatus according to some embodiments of the present disclosure comprises a chamber 100, a vacuum module 105, a gas feeder 110, a gas source 111, a stage 120, an electrostatic chuck 130, a first electrode 141, a second electrode 142, a cooling gas supply 150, a first cooling gas supply line 151, a second cooling gas supply line 152, a first dam 161, a second dam 162, a focus ring 170, a junction portion 180, a first power supply 190, a second power supply 106 and a matcher 107.

The chamber 100 may act as a housing that comprises other components inside. The chamber 100 may be a kind of isolated space in which a plasma process is performed on a wafer 10. Since the chamber 100 is isolated from the outside, the process conditions of the plasma process may be adjusted. For example, process conditions such as a temperature and a pressure inside the chamber 100 may be adjusted differently from the outside.

For example, an outlet 103 may be formed on a bottom surface of the chamber 100. Although FIG. 1 shows that the outlet 103 is formed on the bottom surface of the chamber 100, the position of the outlet 103 is not limited. The gas used for the plasma process inside the chamber 100 may be discharged to the outside of the chamber 100 through the outlet 103.

The outlet 103 may be connected to an inlet 104. The inlet 104 may be a passage through which the gas discharged through the outlet 103 and used in the plasma process moves to the vacuum module 105. The inlet 104 may be connected to the vacuum module 105. In some other embodiments, the inlet 104 is omitted and the vacuum module 105 may be in direct contact with the outlet 103.

The vacuum module 105 may suck the gas used in the plasma process inside the chamber 100. The vacuum module 105 may provide a vacuum pressure to the inside of the closed chamber 100 to remove the gas used in the plasma process inside the chamber 100. The outlet 103 may be closed to isolate the inlet 104 from the chamber 100 after the vacuum module 105 sucks the gas used in the plasma process.

For example, an opening 101 may be formed on the side wall of the chamber 100. The opening 101 may be an entrance through the wafer 10 enters and exits. The wafer 10 may be moved from the outside of the chamber 100 to the inside of the chamber 100 through the opening 101. Also, the wafer 10 may be moved to the outside of the chamber 100 through the opening 101 after the plasma process is completed.

Although only one opening 101 is shown in FIG. 1, the present disclosure is not limited thereto. For example, a plurality of openings 101 may be formed on the outer wall of the chamber 100.

The opening 101 may be closed when the outlet 103 for discharging the gas used for the plasma is opened and the vacuum module 105 operates. This is because all the passages other than the outlet 103 are needed to be closed for the discharge of the gas used for the plasma.

The gas feeder 110 may be disposed on the ceiling of the chamber 100. The gas feeder 110 may be disposed over the electrostatic chuck 130. The gas feeder 110 may be grounded through the ground line 102. The gas feeder 110 may supply gas toward an upper surface of the wafer 10 settled on the upper surface of the electrostatic chuck 130.

The gas feeder 110 may supply the gas used for generating of plasma to the inside of the chamber 100, using a plurality of nozzles. In some embodiments, the gas feeder 110 may comprise an upper electrode for the plasma process. In some other embodiments, the gas feeder 110 may directly act as an upper electrode.

The plasma process may comprise dry-etching of the upper surface of the wafer 10 with the gas plasma used for the plasma. For example, the gas feeder 110 may supply the gas used for the plasma process to the inside of the chamber 100.

The gas supply line 112 may be connected to the gas feeder 110. The gas supply line 112 may be connected to the ceiling of the chamber 100. The gas supply line 112 may be connected to a gas source 111 outside the chamber 100. The gas supply line 112 may supply the gas used for the plasma provided from the gas source 111 to the inside of the chamber 100. Although FIG. 1 shows that the gas supply line 112 is disposed on the ceiling of the chamber 100, the position of the gas supply line 112 is not limited. The position of the gas supply line 112 may vary depending on the structure and position of the chamber 100 and the position of the gas source 111.

The gas source 111 stores the gas used for generating the plasma, and then may provide the gas to the inside of the chamber 100 at the time of the plasma process. Although FIG. 1 shows that the gas source 111 supplies gas through the gas supply line 112 from the outside of the chamber 100, the present disclosure is not limited thereto. In some other embodiments, the gas source 111 may be directly attached to the chamber 100.

The stage 120 may be disposed on a lower surface of the chamber 100. The stage 120 may support an electrostatic chuck 130 disposed on the stage 120. In some embodiments, the stage 120 may comprise a lower electrode for the plasma process. In some other embodiments, the stage 120 may directly act as a lower electrode.

The stage 120 may be connected to the second power supply 106 and the matcher 107. The second power supply 106 may be, for example, an AC power supply. The second power supply 106 may provide a bias voltage and a RF signal for the plasma process. The plasma may reach the upper surface of the wafer 10 by formation of electric field. Since the plasma contains ionized particles having charges, it may travel in a desired direction (a vertical direction) by formation of the electric field.

The matcher 107 may be connected to the second power supply 106. The matcher 107 may be disposed between the second power supply 106 and the stage 120. For example, the matcher 107 may transfer one of a plurality of frequencies to the stage 120 using a plurality of capacitors, and may block the rest.

In example embodiments, the matcher 107 may perform impedance matching between an electric circuit, which is formed by the gas feeder 110 as the upper electrode and the stage 120 as the lower electrode in the plasma process performed in the chamber 100, and the second power supply 106. Here, 'impedance matching' refers to matching the impedance of a power supply to the impedance of a load.

A reflected power output of the electric circuit formed by the upper electrode and the lower electrode in the plasma process should be minimized. For example, the greater the reflected power output generated from the electric circuit formed by the upper electrode and the lower electrode, the smaller the total output for plasma formation. The reflected power output can be minimized by matching the impedance of the electric circuit formed by the upper electrode and the lower electrode to the impedance of the power supply. The matcher 107 may perform impedance matching by, for example, adjusting the capacitance of a capacitor included in the matcher 107.

The electrostatic chuck 130 may be disposed on the stage 120. The electrostatic chuck 130 may support the wafer 10 disposed on the electrostatic chuck 130.

The electrostatic chuck 130 may comprise a first portion 131 disposed on the stage 120, and a second portion 132 disposed on the first portion 131. A width W1 of the first portion 131 of the electrostatic chuck 130 in the first direction DR1 may be greater than a width W2 of the second portion 132 of the electrostatic chuck 130 in the first direction DR1. For example, at least a part of the upper surface of the first portion 131 of the electrostatic chuck 130 may be exposed on the side wall of the second portion 132 of the electrostatic chuck 130.

Each of the upper surface of the first portion 131 of the electrostatic chuck 130 and the upper surface of the second portion 132 of the electrostatic chuck 130 may have a circular planar shape in a plane defined by the first direction DR1 and the second direction DR2. However, the present disclosure is not limited thereto.

The electrostatic chuck 130 may include, for example, ceramic. However, the present disclosure is not limited thereto.

The first electrode 141 may be disposed inside the electrostatic chuck 130. For example, the first electrode 141 may be located inside the second portion 132 of the electrostatic chuck 130. The first electrode 141 may be disposed to be adjacent to the upper surface of the second portion 132 of the electrostatic chuck 130. The first electrode 141 may have a circular shape in a plane defined by the first direction DR1 and the second direction DR2. However, the present disclosure is not limited thereto.

The second electrode 142 may be disposed inside the electrostatic chuck 130. For example, the second electrode 142 may be located inside the second portion 132 of the electrostatic chuck 130. The second electrode 142 may be disposed adjacent to the upper surface of the second portion 132 of the electrostatic chuck 130.

The second electrode 142 may have a ring shape surrounding the first electrode 141 in a plane defined by the first direction DR1 and the second direction DR2. The second electrode 142 may be disposed on the same plane as the first electrode 141. The second electrode 142 may be spaced apart from the first electrode 141.

The first power supply 190 may apply a DC voltage to each of the first electrode 141 and the second electrode 142. The first electrode 141 and the second electrode 142 may chuck the wafer 10, using the voltage applied from the first power supply 190.

The first power supply 190 may control the voltage applied to the first electrode 141, using a first switch 191. Further, the first power supply 190 may control the voltage applied to the second electrode 142, using a second switch 192. For example, the first power supply 190 may independently control the voltage applied to the first electrode 141 and the voltage applied to the second electrode 142.

The first dam 161 may be disposed on the electrostatic chuck 130. Specifically, the first dam 161 may protrude from the upper surface of the second portion 132 of the electrostatic chuck 130. The first dam 161 may be disposed along the edge of the upper surface of the second portion 132 of the electrostatic chuck 130. For example, the first dam 161 may have a ring shape on the plane defined by the first direction DR1 and the second direction DR2.

The second dam 162 may be disposed on the electrostatic chuck 130. Specifically, the second dam 162 may protrude from the upper surface of the second portion 132 of the electrostatic chuck 130. The second dam 162 may overlap the second electrode 142 in a third direction DR3 which is a vertical direction. The second dam 162 may be disposed inside the first dam 161. The second dam 162 may be spaced apart from the first dam 161.

The wafer 10 may be located on the first dam 161 and the second dam 162. The wafer 10 may be located to be in contact with each of the first dam 161 and the second dam 162.

A plurality of cooling gas supply lines 151 and 152 may penetrate each of the stage 120 and the electrostatic chuck 130. The plurality of cooling gas supply lines 151 and 152 may extend to the upper surface of the second portion 132 of the electrostatic chuck 130. A plurality of cooling gas supply lines 151 and 152 may include a first cooling gas supply line 151 and a second cooling gas supply line 152.

The first cooling gas supply line 151 may penetrate the first electrode 141 in the third direction DR3. As shown in FIG. 3, the first cooling gas supply line 151 may be exposed on the upper surface of the second portion 132 of the electrostatic chuck 130 in a plurality of hole shapes spaced apart from each other. The first cooling gas supply line 151 may be exposed inside the second dam 162 on the upper surface of the second portion 132 of the electrostatic chuck 130. The arrangement of the exposed holes of the first cooling gas supply line 151 shown in FIG. 3 is an example, and the present disclosure is not limited thereto.

The second cooling gas supply line 152 may penetrate the second electrode 142 in the third direction DR3. As shown in FIG. 3, the second cooling gas supply line 152 may be exposed on the upper surface of the second portion 132 of the electrostatic chuck 130 in a plurality of hole shapes spaced apart from each other. The second cooling gas supply line 152 may be exposed between the first dam 161 and the second dam 162 on the upper surface of the second portion 132 of the electrostatic chuck 130. The arrangement of the exposed holes of the second cooling gas supply line 152 shown in FIG. 3 is an example, and the present disclosure is not limited thereto.

The cooling gas supply 150 may be connected to each of the first cooling gas supply line 151 and the second cooling gas supply line 152. The cooling gas supply 150 may supply cooling gas to each of the first cooling gas supply line 151 and the second cooling gas supply line 152. In this case, although the cooling gas may include, for example, helium (He), the present disclosure is not limited thereto.

The cooling gas provided from the cooling gas supply 150 may be provided to the lower surface of the wafer 10 through the first cooling gas supply line 151 and the second cooling gas supply line 152. For example, the cooling gas may be continuously provided to the lower surface of the wafer 10 while the plasma process is being performed. The wafer 10 heated while the plasma process is performed may be cooled using the cooling gas provided through the first cooling gas supply line 151 and the second cooling gas supply line 152.

The focus ring 170 may be disposed to surround the side walls of the second portion 132 of the electrostatic chuck 130. At least a part of the focus ring 170 may overlap the first portion 131 of the electrostatic chuck 130 in the third direction DR3.

Although FIGS. 1 and 5 show that the focus ring 170 is spaced apart from the side walls of the second portion 132 of the electrostatic chuck 130, the present disclosure is not limited thereto. In some other embodiments, the focus ring 170 may come into contact with the side walls of the second portion 132 of the electrostatic chuck 130.

The focus ring 170 may have a ring shape in a plane defined by the first direction DR1 and the second direction DR2. Although the focus ring 170 may include, for example, at least one of silicon (Si), silicon carbide (SiC) and silicon oxide ($SiO_2$), the present disclosure is not limited thereto.

The junction portion 180 may be disposed between the first portion 131 of the electrostatic chuck 130 and the focus ring 170. The lower surface of the junction portion 180 may come into contact with the upper surface of the first portion 131 of the electrostatic chuck 130 exposed on the side walls of the second portion 132 of the electrostatic chuck 130. The upper surface of the junction portion 180 may come into contact with the focus ring 170.

The junction portion 180 may comprise a first layer 181, a second layer 182, and a first bonding layer 185. The first layer 181 may be disposed on the first portion 131 of the electrostatic chuck 130. The second layer 182 may be disposed on the first layer 181. The first bonding layer 185 may be disposed on the second layer 182.

The first layer 181 may include, for example, silicone rubber. However, the present disclosure is not limited thereto. The first layer 181 may have a first thickness t1 in the third direction DR3. The first thickness t1 may be, for example, 60 μm to 350 μm.

The second layer 182 may include a metal. The second layer 182 may include, for example, aluminum (Al). However, the present disclosure is not limited thereto. The second layer 182 may have a second thickness t2 in the third direction DR3. The second thickness t2 may be, for example, 30 μm to 70 μm.

In example embodiments, the plasma process apparatus according to aspects of the invention may control a thermal conductivity by adjusting a ratio of the first thickness t1 of the first layer 181 to the second thickness t2 of the second layer 182a. If the second thickness t2 of the second layer 182 is too thin a performance control of the second layer as a heat transfer material may difficult, and if too thick an arching risk may increase. Thus, the plasma process apparatus according to certain embodiments of the invention may control a difference between a temperature on a surface of the wafer 10 and a temperature of the focus ring 170 under, for example, ±10% by the ratio of the first thickness t1 to the second thickness t2 being 2:1. For example, the first thickness t1 of the first layer 181 may be two to five times thicker than the second thickness t2 of the second layer 182.

The first bonding layer 185 may bond the second layer 182 and the focus ring 170. Therefore, the junction portion 180 may be formed integrally with the focus ring 170. By bonding the second layer 182 and the focus ring 170 through the first bonding layer 185, the junction portion 180 and the focus ring 170 may be prevented from being separated from each other, when the focus ring 170 is attached and detached.

Although the first bonding layer 185 may include, for example, silicon, the present disclosure is not limited thereto.

In the plasma process apparatus according to some embodiments of the present disclosure, by forming the first layer 181 of the junction portion 180 coming into contact with the electrostatic chuck 130 with a silicone rubber having ductility, a contact area between the electrostatic chuck 130 and the junction portion 180 may be increased. As a result, the heat transfer efficiency of the junction portion 180 can be improved.

Further, in the plasma process apparatus according to some embodiments of the present disclosure, by forming the first layer 181 of the junction portion 180 coming into contact with the electrostatic chuck 130 with a silicone rubber having low adhesiveness, the time taken for removing the focus ring 170 can be reduced.

Further, in the plasma process apparatus according to some embodiments of the present disclosure, because the junction portion 180 is formed to comprise the first layer 181 including silicone rubber and the second layer 182 including aluminum (Al), the structural stability of the junction portion 180 can be maintained in the temperature range between −50° C. and 250° C. As a result, the reliability of joining may be maintained even when the temperature of the focus ring 170 rises to 250° C. through the plasma process.

Further, in the plasma process apparatus according to some embodiments of the present disclosure, the first electrode 141 and the second electrode 142 are disposed inside the electrostatic chuck 130 to be spaced apart from each other, and the voltage applied to each of the first electrode 141 and the second electrode 142 is independently controlled using one power supply 190. Thus, the plasma process apparatus according to aspects of the invention may prevent the wafer 10 from being damaged in the process of dechucking the wafer 10. A detailed explanation of the method for dechucking the wafer will be explained later.

Hereinafter, a method for dechucking the wafer in the plasma process apparatus according to some embodiments of the present disclosure will be explained referring to FIGS. 6 to 8.

Figure 6:
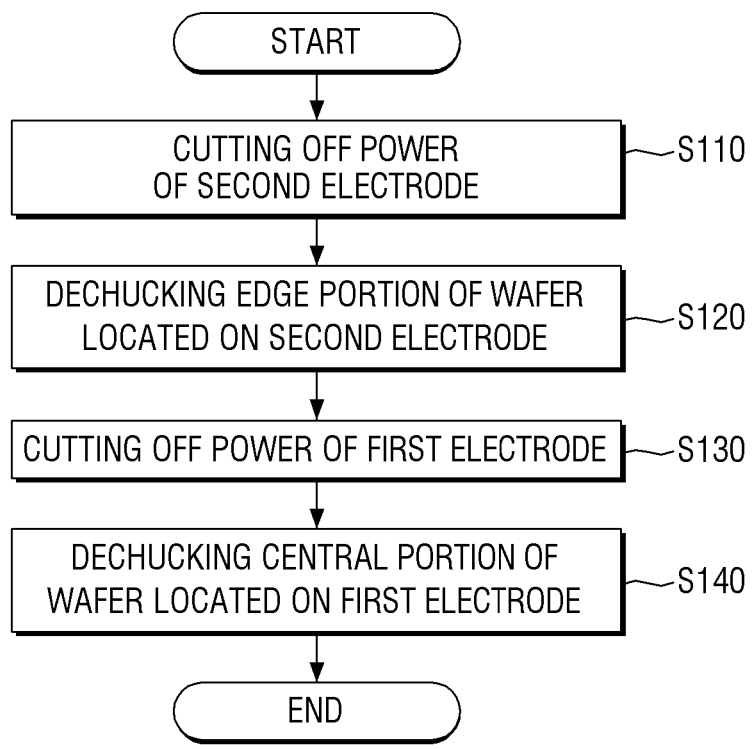
FIG. 6 is a flowchart for explaining a method for dechucking a wafer in the plasma process apparatus according to some embodiments of the present disclosure.

FIG. 6 is a flowchart for explaining the method for dechucking the wafer in the plasma process apparatus according to some embodiments of the present disclosure. FIGS. 7 and 8 are diagrams for explaining the method for dechucking the wafer in the plasma process apparatus according to some embodiments of the present disclosure.

A wafer 10 is loaded onto the electrostatic chuck 130 and a plasma process may be performed on the wafer 10 inside the chamber 100. After the plasma process of the wafer 10 is completed, dechucking of the wafer 10 may be performed.

Figure 7:
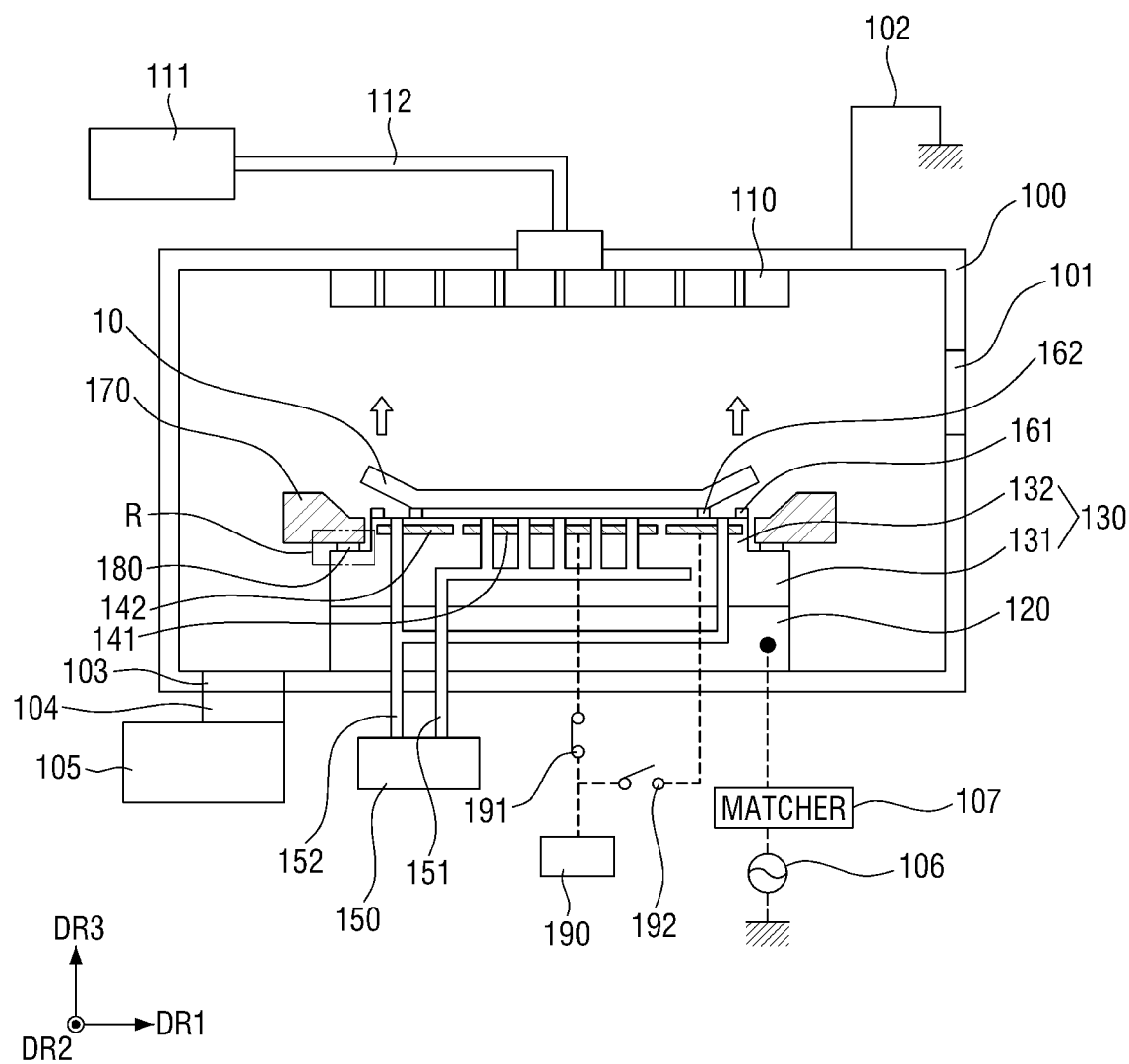
FIGS. 7 and 8 are diagrams for explaining a method for dechucking the wafer in the plasma process apparatus according to some embodiments of the present disclosure.

Referring to FIGS. 6 and 7, after the plasma process of the wafer 10 is completed, the power supply of the second electrode 142 may be cut off (S110). By cutting off the second switch 192, the voltage applied from the first power supply 190 to the second electrode 142 may be cut off.

Subsequently, the edge portion of the wafer 10 located on the second electrode 142 may be dechucked (S120). By cutting off the voltage provided to the second electrode 142, attractive force between the wafer 10 and the second electrode 142 may be reduced. As a result, the edge portion of the wafer 10 located on the second electrode 142 may be easily dechucked.

Figure 8:
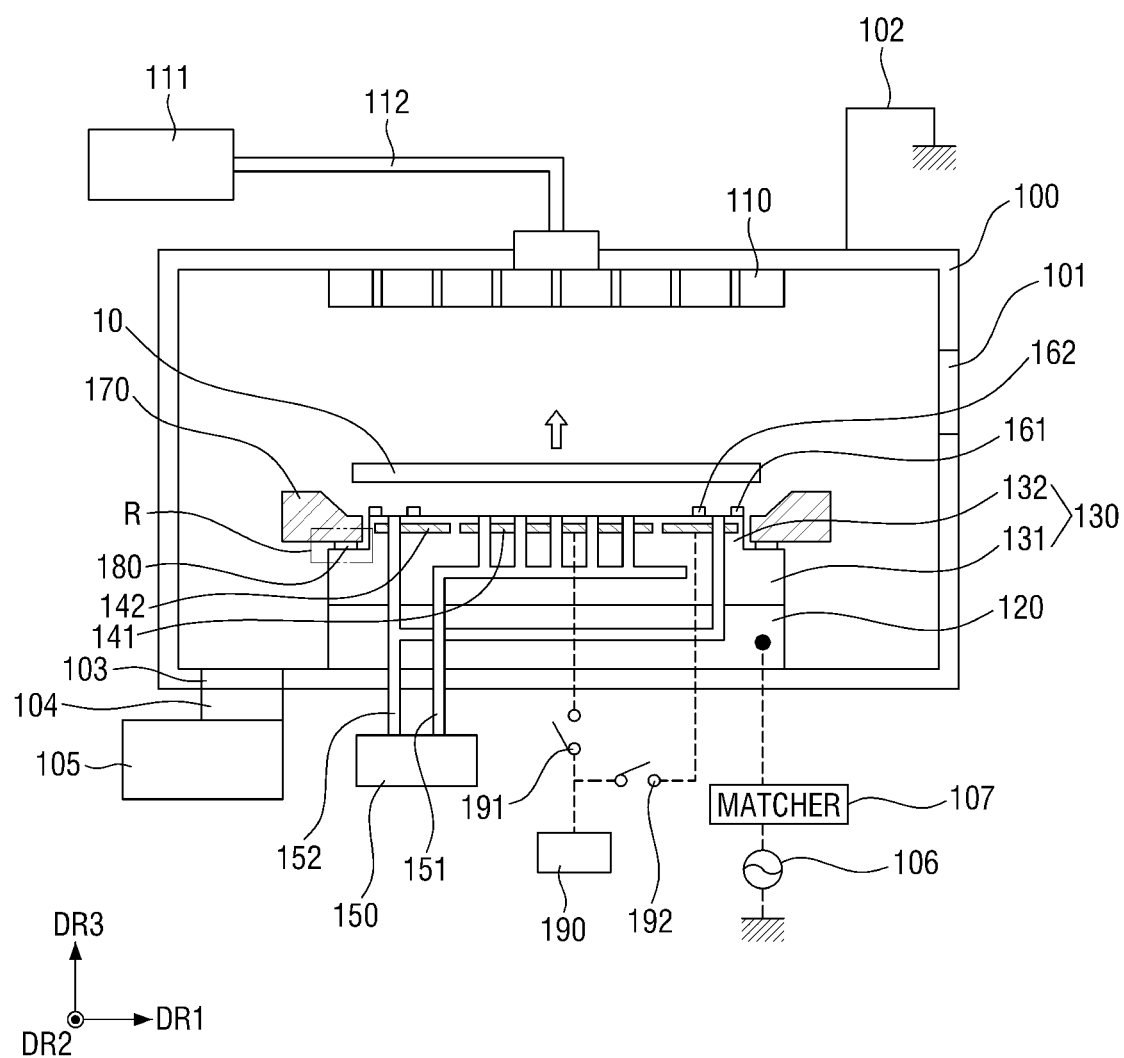

Referring to FIGS. 6 and 8, after dechucking the edge portion of the wafer 10 located on the second electrode 142, the power supply of the first electrode 141 may be cut off (S130). By cutting off the first switch 191, the voltage applied from the first power supply 190 to the first electrode 141 may be cut off.

Subsequently, a central portion of the wafer 10 located on the first electrode 141 may be dechucked (S140). By cutting off the voltage provided to the first electrode 141, the attractive force between the wafer 10 and the first electrode 141 may be reduced. As a result, the central portion of the wafer 10 located on the first electrode 141 may be easily dechucked.

Hereinafter, the method for dechucking the wafer in the plasma process apparatus according to some other embodiments of the present disclosure will be explained referring to FIG. 9. Differences from the method for dechucking the wafer in the plasma process apparatus shown in FIG. 6 will be mainly explained.

Figure 9:
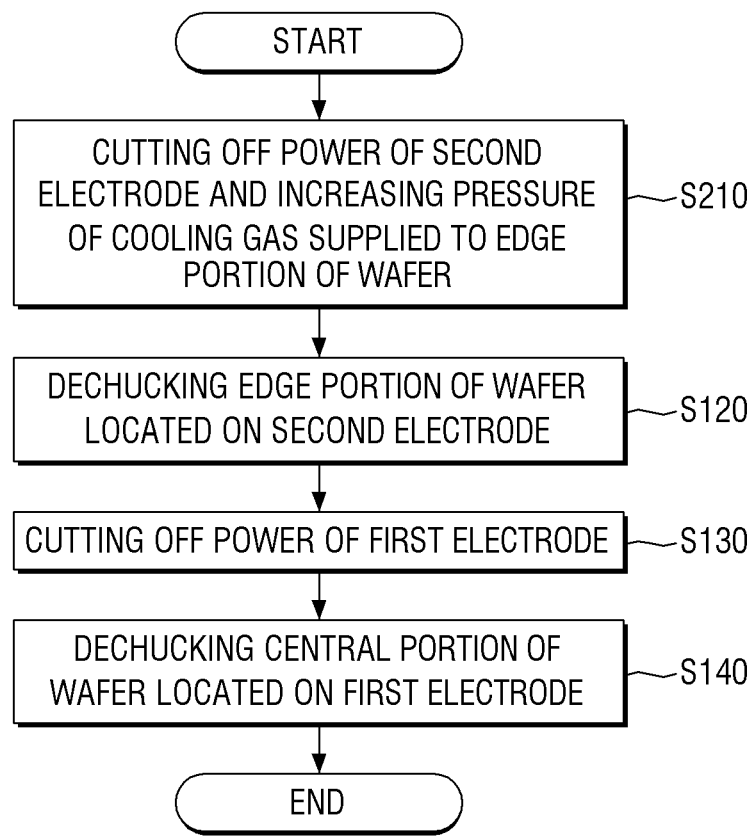
FIG. 9 is a flowchart for explaining a method for dechucking the wafer in the plasma process apparatus according to some other embodiments of the present disclosure.

FIG. 9 is a flowchart for explaining a method for dechucking the wafer in the plasma process apparatus according to some other embodiments of the present disclosure.

Referring to FIG. 9, in the method for dechucking the wafer in the plasma process apparatus according to some other embodiment of the present disclosure, after the plasma process of the wafer 10 is completed, the power supply of the second electrode 142 is cut off, and the pressure of the cooling gas supplied to the edge portion of the wafer 10 may be increased (S210).

The cooling gas supply 150 maintains the pressure of the cooling gas supplied through the first cooling gas supply line 151, and may increase the pressure of the cooling gas supplied through the second cooling gas supply line 152. As a result, the edge portion of the wafer 10 may be effectively dechucked.

In some embodiments, after the power supply of the second electrode 142 is cut off, the pressure of the cooling gas supplied to the edge portion of the wafer 10 through the second cooling gas supply line 152 may be increased. In some other embodiments, after the pressure of the cooling gas supplied to the edge portion of the wafer 10 through the second cooling gas supply line 152 is increased, the power supply of the second electrode 142 may be cut off. In some other embodiments, cut-off of the power supply of the second electrode 142 and the increase in the pressure of the cooling gas supplied to the edge portion of the wafer 10 through the second cooling gas supply line 152 may be performed simultaneously.

Hereinafter, a method for dechucking the wafer in a plasma process apparatus according to some other embodiments of the present disclosure will be explained referring to FIG. 10. Differences from the method for dechucking the wafer in the plasma process apparatus shown in FIG. 6 will be mainly explained.

Figure 10:
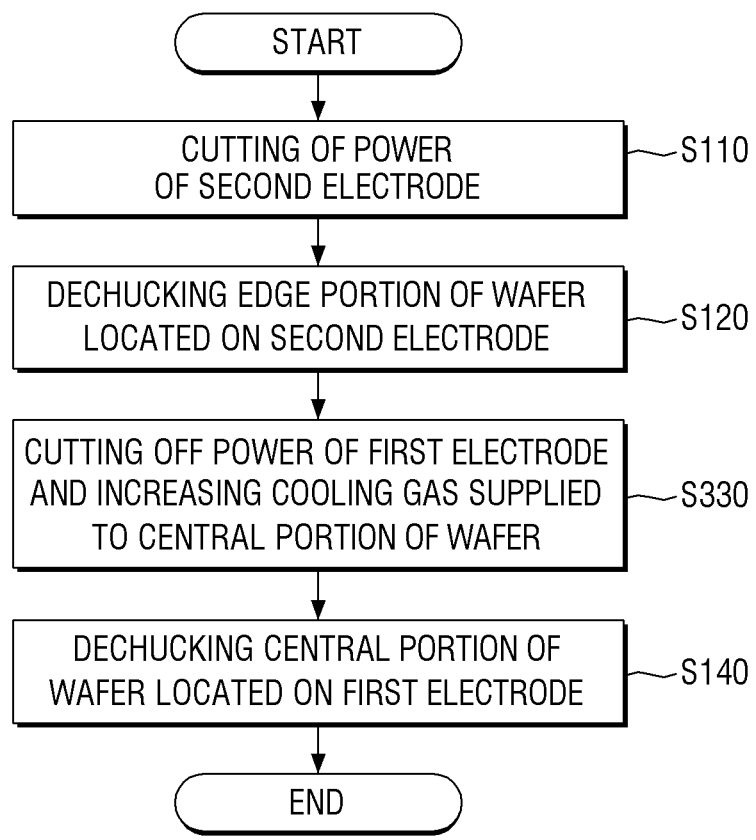
FIG. 10 is a flowchart for explaining a method for dechucking the wafer in the plasma process apparatus according to some other embodiments of the present disclosure.

FIG. 10 is a flowchart for explaining a method for dechucking the wafer in a plasma process apparatus according to some other embodiments of the present disclosure.

Referring to FIG. 10, in the method for dechucking the wafer in the plasma process apparatus according to some other embodiment of the present disclosure, after dechucking the edge portion of the wafer 10 located on the second electrode 142, the power supply of the first electrode 141 is cut off, and the pressure of the cooling gas supplied to the central portion of the wafer 10 may be increased (S330).

The cooling gas supply 150 maintains the pressure of the cooling gas supplied through the second cooling gas supply line 152, and may increase the pressure of the cooling gas supplied through the first cooling gas supply line 151. As a result, the central portion of the wafer 10 may be effectively dechucked.

In some embodiments, after the power supply of the first electrode 141 is cut off, the pressure of the cooling gas supplied to the central portion of the wafer 10 through the first cooling gas supply line 151 may be increased. In some other embodiments, after the pressure of the cooling gas supplied to the central portion of the wafer 10 through the first cooling gas supply line 151 is increased, the power supply of the first electrode 141 may be cut off. In some other embodiments, cut-off of power supply of the first electrode 141 and the increase in the pressure of the cooling gas supplied to the central portion of the wafer 10 through the first cooling gas supply line 151 may be performed simultaneously.

Hereinafter, a method for dechucking a wafer in a plasma process apparatus according to some other embodiments of the present disclosure will be explained referring to FIG. 11. Differences from the method for dechucking the wafer in the plasma process apparatus shown in FIG. 6 will be mainly explained.

Figure 11:
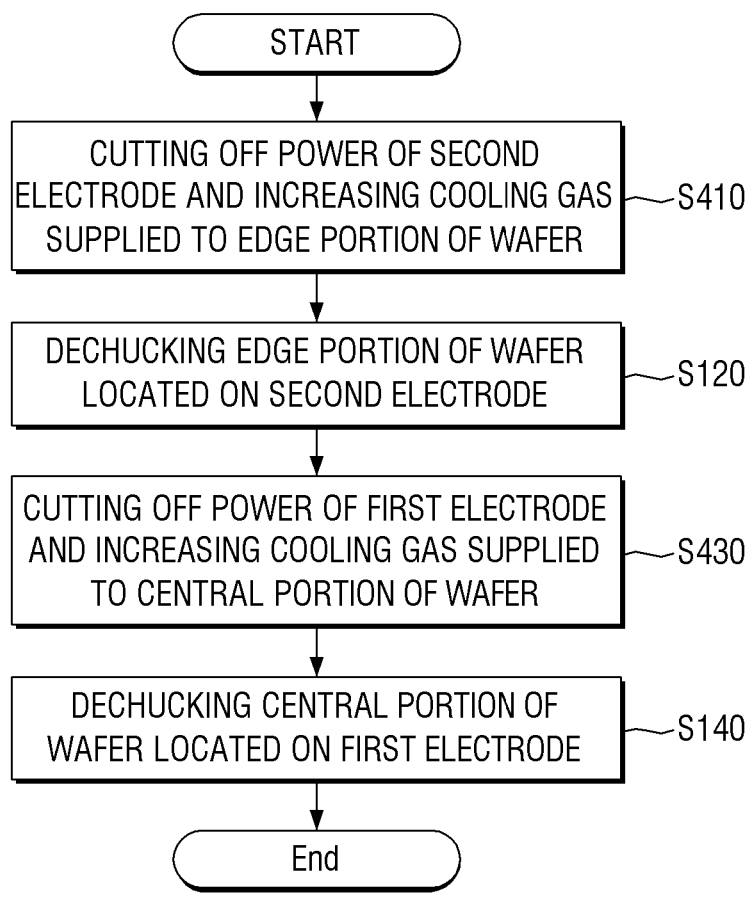
FIG. 11 is a flowchart for explaining a method for dechucking the wafer in the plasma process apparatus according to some other embodiments of the present disclosure.

FIG. 11 is a flowchart for explaining a method for dechucking the wafer in a plasma process apparatus according to some other embodiments of the present disclosure.

Referring to FIG. 11, in the method for dechucking the wafer in the plasma process apparatus according to some other embodiment of the present disclosure, after the plasma process of the wafer 10 is completed, the power supply of the second electrode 142 is cut off, and the pressure of the cooling gas supplied to the edge portion of the wafer 10 through the first cooling gas supply line 151 may be increased (S410).

The cooling gas supply 150 maintains the pressure of the cooling gas supplied through the first cooling gas supply line 151, and may increase the pressure of the cooling gas supplied through the second cooling gas supply line 152. As a result, the edge portion of the wafer 10 may be effectively dechucked.

Subsequently, after dechucking the edge portion of the wafer 10 located on the second electrode 142, the power supply of the first electrode 141 is cut off, and the pressure of the cooling gas supplied to the central portion of the wafer 10 through the second cooling gas supply line 152 may be increased (S430).

The cooling gas supply 150 maintains the pressure of the cooling gas supplied through the second cooling gas supply line 152, and may increase the pressure of the cooling gas supplied through the first cooling gas supply line 151. As a result, the central portion of the wafer 10 may be effectively dechucked.

Hereinafter, a method for dechucking a wafer in a plasma process apparatus according to some other embodiments of the present disclosure will be explained referring to FIG. 12. Differences from the method for dechucking the wafer in the plasma process apparatus shown in FIG. 6 will be mainly explained.

Figure 12:
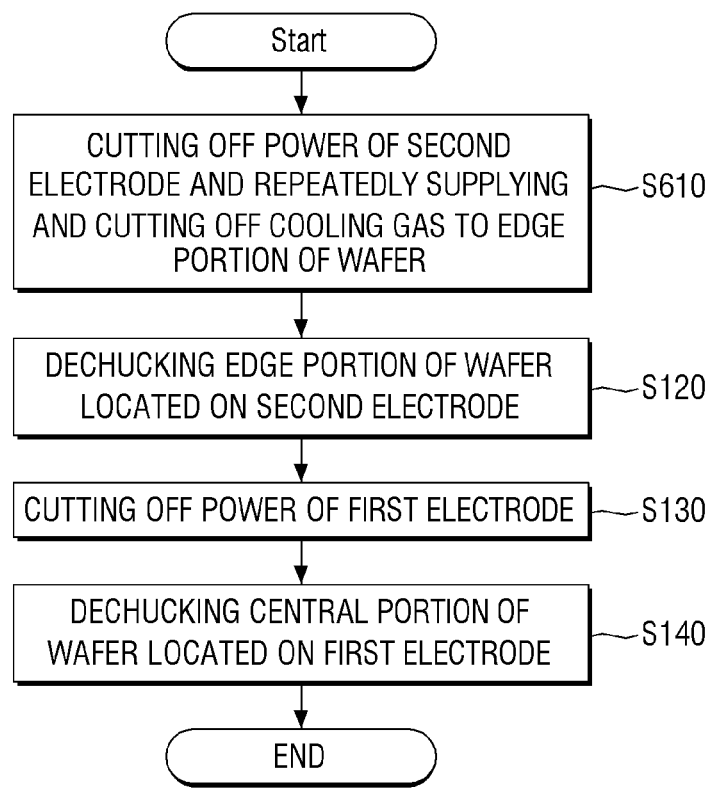
FIG. 12 is a flowchart for explaining a method for dechucking the wafer in the plasma process apparatus according to some other embodiments of the present disclosure.

FIG. 12 is a flowchart for explaining the method for dechucking the wafer in the plasma process apparatus according to some other embodiments of the present disclosure.

Referring to FIG. 12, in the method for dechucking the wafer in the plasma process apparatus according to some other embodiment of the present disclosure, after the plasma process on the wafer 10 is completed, the power supply of the second electrode 142 is cut off, and the supply and cut-off of the cooling gas to the edge portion of the wafer 10 may be repeated (S610).

The cooling gas supply 150 may maintain the pressure of the cooling gas supplied through the first cooling gas supply line 151. The cooling gas supply 150 may periodically repeat the supply and cut-off of the cooling gas through the second cooling gas supply line 152. As a result, the edge portion of the wafer 10 may be effectively dechucked.

In some embodiments, the pressure of the cooling gas when the cooling gas supply 150 supplies the cooling gas through the second cooling gas supply line 152 may be the same as the pressure of the cooling supplied through the first cooling gas supply line 151. In some other embodiments, the pressure of the cooling gas when the cooling gas supply 150 supplies the cooling gas through the second cooling gas supply line 152 may be higher than the pressure of the cooling gas supplied through the first cooling gas supply line 151.

In some embodiments, after the power supply of the second electrode 142 is cut off, the supply and cut-off of cooling gas to the edge portion of the wafer 10 through the second cooling gas supply line 152 may be periodically repeated. In some other embodiments, after the supply and cut-off of the cooling gas to the edge portion of the wafer 10 through the second cooling gas supply line 152 are periodically repeated, the power supply of the second electrode 142 may be cut off. In some other embodiments, the cut-off of the power supply of the second electrode 142 and the periodic repetition of the supply and cut-off of the cooling gas to the edge portion of the wafer 10 through the second cooling gas supply line 152 may be performed at the same time.

Hereinafter, a method for dechucking a wafer in a plasma process apparatus according to some other embodiments of the present disclosure will be explained referring to FIG. 13. Differences from the method for dechucking the wafer in the plasma process apparatus shown in FIG. 6 will be mainly explained.

Figure 13:
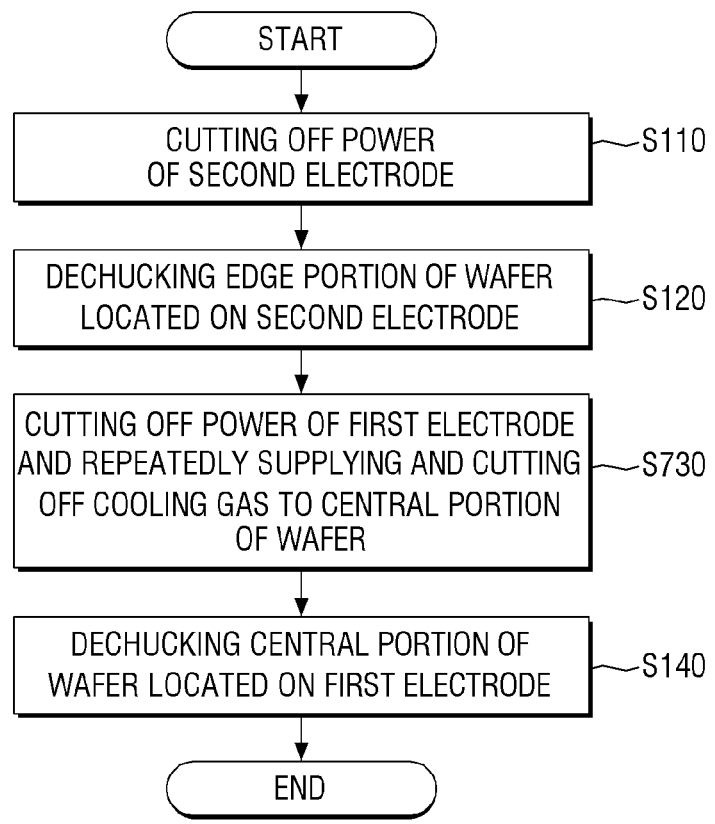
FIG. 13 is a flowchart for explaining a method for dechucking the wafer in the plasma process apparatus according to some other embodiments of the present disclosure.

FIG. 13 is a flowchart for explaining a method for dechucking a wafer in a plasma process apparatus according to some other embodiments of the present disclosure.

Referring to FIG. 13, in the method for dechucking the wafer in the plasma process apparatus according to some other embodiment of the present disclosure, after dechucking the edge portion of the wafer 10 located on the second electrode 142, the power supply of the first electrode 141 is cut off, and the supply and cut-off of the cooling gas to the central portion of the wafer 10 through the first cooling gas supply line 151 may be repeated (S730).

The cooling gas supply 150 may maintain the pressure of the cooling gas supplied through the second cooling gas supply line 152. The cooling gas supply 150 may periodically repeat the supply and cut-off of the cooling gas through the first cooling gas supply line 151. As a result, the central portion of the wafer 10 may be effectively dechucked.

In some embodiments, the pressure of the cooling gas when the cooling gas supply 150 supplies the cooling gas through the first cooling gas supply line 151 may be the same as the pressure of the cooling gas supplied through the second cooling gas supply line 152. In some other embodiments, the pressure of the cooling gas when the cooling gas supply 150 supplies the cooling gas through the first cooling gas supply line 151 may be higher than the pressure of the cooling gas supplied through the second cooling gas supply line 152.

In some embodiments, after the power supply of the first electrode 141 is cut off, the supply and cut-off of the cooling gas to the central portion of the wafer 10 through the first cooling gas supply line 151 may be repeated periodically. In some other embodiments, after the supply and cut-off of the cooling gas to the central portion of the wafer 10 through the first cooling gas supply line 151 are periodically repeated, the power supply of the first electrode 141 may be cut off. In some other embodiments, the cut-off of power supply of the first electrode 141 and the periodic repetition of the supply and cut-off of the cooling gas to the central portion of the wafer 10 through the first cooling gas supply line 151 may be performed at the same time.

Hereinafter, a method for dechucking a wafer in a plasma process apparatus according to some other embodiments of the present disclosure will be explained referring to FIG. 14. Differences from the method for dechucking the wafer in the plasma process apparatus shown in FIG. 6 will be mainly explained.

Figure 14:
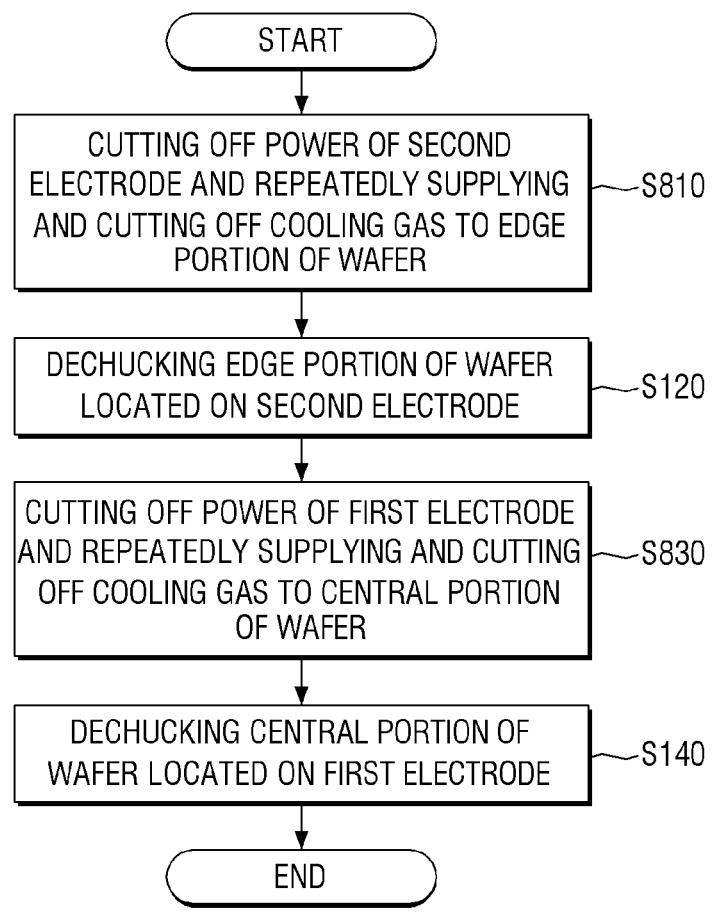
FIG. 14 is a flowchart for explaining a method for dechucking the wafer in the plasma process apparatus according to some other embodiments of the present disclosure.

FIG. 14 is a flowchart for explaining a method for dechucking a wafer in a plasma process apparatus according to some other embodiments of the present disclosure.

Referring to FIG. 14, in the method for dechucking the wafer in the plasma process apparatus according to some other embodiment of the present disclosure, after the plasma process on the wafer 10 is completed, the power supply of the second electrode 142 is cut off, and the supply and cut-off of the cooling gas to the edge portion of the wafer 10 through the second cooling gas supply line 152 may be repeated (S810).

The cooling gas supply 150 may maintain the pressure of the cooling gas supplied through the first cooling gas supply line 151. The cooling gas supply 150 may periodically repeat the supply and cut-off of the cooling gas through the second cooling gas supply line 152. As a result, the edge portion of the wafer 10 may be effectively dechucked.

In some embodiments, the pressure of the cooling gas when the cooling gas supply 150 supplies the cooling gas through the second cooling gas supply line 152 may be the same as the pressure of the cooling gas supplied through the first cooling gas supply line 151. In some other embodiments, the pressure of the cooling gas when the cooling gas supply 150 supplies the cooling gas through the second cooling gas supply line 152 may be higher than the pressure of the cooling gas supplied through the first cooling gas supply line 151.

Subsequently, after dechucking the edge portion of the wafer 10 located on the second electrode 142, the power supply of the first electrode 141 is cut off, and the supply and cut-off of the cooling gas to the central portion of the wafer 10 through the first cooling gas supply line 151 may be repeated (S830).

The cooling gas supply 150 may maintain the pressure of the cooling gas supplied through the second cooling gas supply line 152. The cooling gas supply 150 may periodically repeat the supply and cut-off of the cooling gas through the first cooling gas supply line 151. As a result, the central portion of the wafer 10 may be effectively dechucked.

In some embodiments, the pressure of the cooling gas when the cooling gas supply 150 supplies the cooling gas through the first cooling gas supply line 151 may be the same as the pressure of the cooling gas supplied through the second cooling gas supply line 152. In some other embodiments, the pressure of the cooling gas when the cooling gas supply 150 supplies the cooling gas through the first cooling gas supply line 151 may be higher than the pressure of the cooling gas supplied through the second cooling gas supply line 152.

A plasma process apparatus according to some other embodiments of the present disclosure will be explained below referring to FIG. 15. Differences from the plasma process apparatus shown in FIGS. 1 and 5 will be mainly explained.

Figure 15:
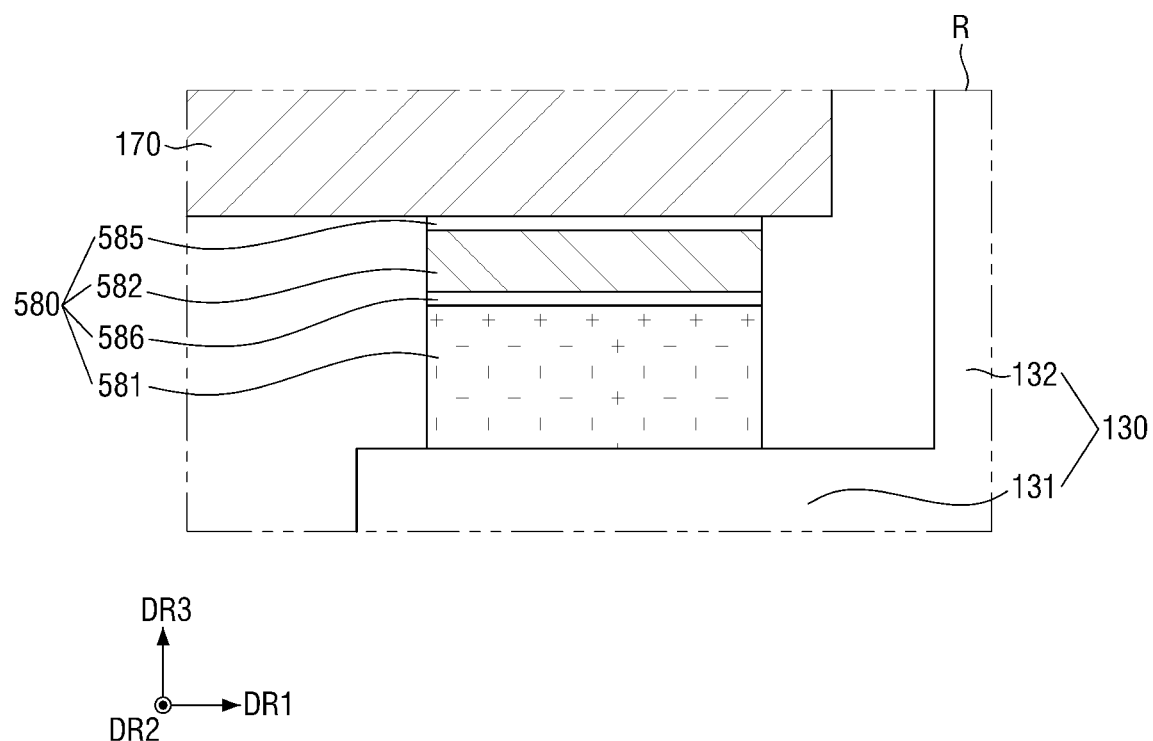
FIG. 15 is an enlarged view of a region R of FIG. 1 for explaining a plasma process apparatus according to some other embodiments of the present disclosure.

FIG. 15 is an enlarged view of a region R of FIG. 1 for explaining a plasma process apparatus according to some other embodiments of the present disclosure.

Referring to FIG. 15, in the plasma process apparatus according to some other embodiments of the present disclosure, a junction portion 580 may comprise a first layer 581, a second layer 582, a first bonding layer 585 and a second bonding layer 586.

The first layer 581 may be disposed on the first portion 131 of the electrostatic chuck 130. The second bonding layer 586 may be disposed on the first layer 581. The second layer 582 may be disposed on the second bonding layer 586. The first bonding layer 585 may be disposed on the second layer 582.

The first layer 581 may include, for example, silicone rubber. The second layer 582 may include a metal. The second layer 582 may include, for example, aluminum (Al). Each of the first bonding layer 585 and the second bonding layer 586 may include, for example, silicon.

A plasma process apparatus according to some other embodiments of the present disclosure will be explained below referring to FIG. 16. Differences from the plasma process apparatus shown in FIGS. 1 and 5 will be mainly explained.

Figure 16:
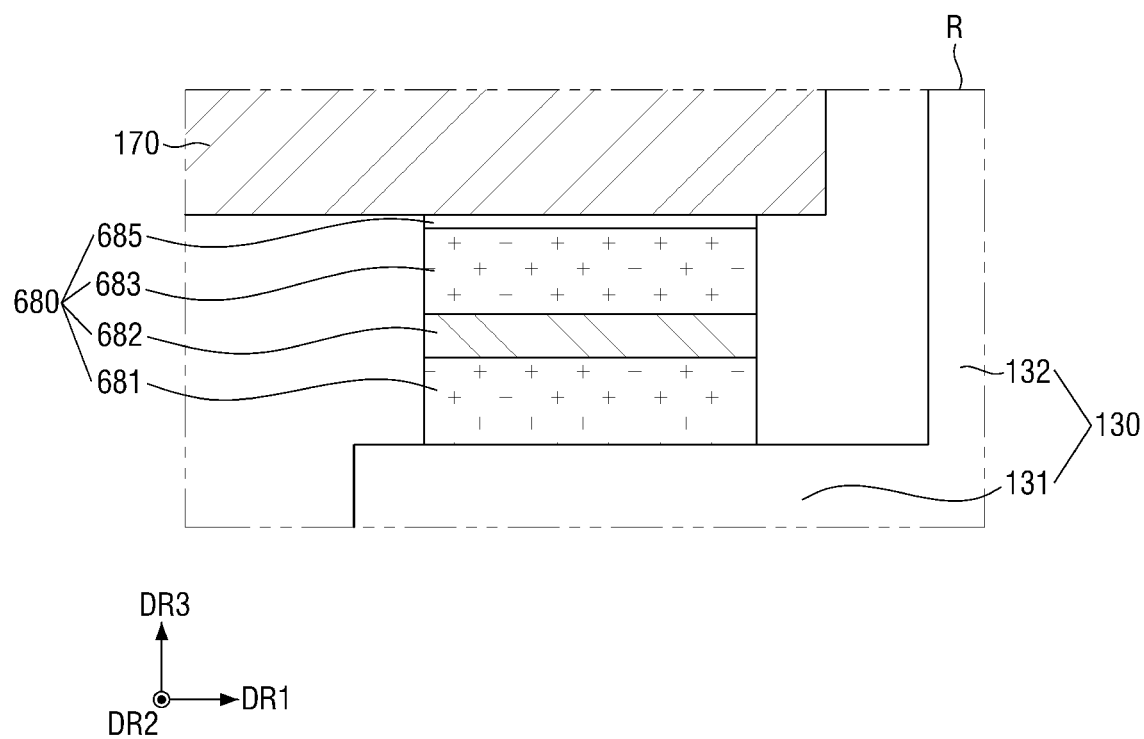
FIG. 16 is an enlarged view of a region R of FIG. 1 for explaining a plasma process apparatus according to some other embodiments of the present disclosure.

FIG. 16 is an enlarged view of a region R of FIG. 1 for explaining a plasma process apparatus according to some other embodiments of the present disclosure.

Referring to FIG. 16, in the plasma process apparatus according to some other embodiment of the present disclosure, a junction portion 680 may comprise a first layer 681, a second layer 682, a third layer 683 and a first bonding layer 685.

The first layer 681 may be disposed on the first portion 131 of the electrostatic chuck 130. The second layer 682 may be disposed on the first layer 681. The third layer 683 may be disposed on the second layer 682. The first bonding layer 685 may be disposed on the third layer 683.

The third layer 683 may include the same material as the first layer 681. Each of the first layer 681 and the third layer 683 may include, for example, silicone rubber. The second layer 682 may include metal. The second layer 682 may include, for example, aluminum (Al). The first bonding layer 685 may include, for example, silicon.

Hereinafter, a plasma process apparatus according to some other embodiments of the present disclosure will be explained referring to FIG. 17. Differences from the plasma process apparatus shown in FIGS. 1 and 2 will be mainly explained.

Figure 17:
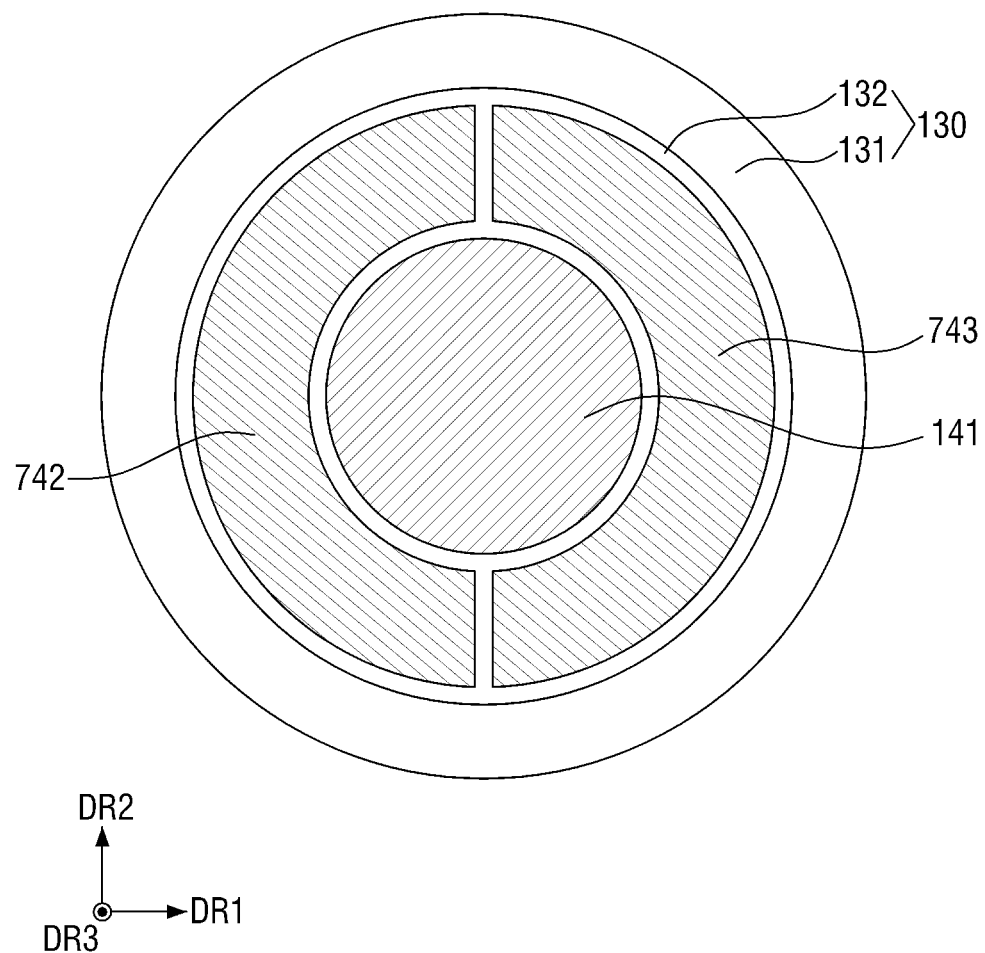
FIG. 17 is a plan view for explaining first to third electrodes of a plasma process apparatus according to some other embodiments of the present disclosure.

FIG. 17 is a plan view for explaining first to third electrodes of a plasma process apparatus according to some other embodiments of the present disclosure.

Referring to FIG. 17, in the plasma process apparatus according to some other embodiment of the present disclosure, a first electrode 141, a second electrode 742 and a third electrode 743 may be disposed inside the second portion 132 of the electrostatic chuck 130.

The first electrode 141, the second electrode 742, and the third electrode 743 may be disposed on the same plane to be spaced apart from each other. The first electrode 141 may have a circular shape in a plane defined by the first direction DR1 and the second direction DR2. The second electrode 742 may surround a first side wall of the first electrode 141. The third electrode 743 may surround a second side wall of the first electrode 141 opposite to the first side wall of the first electrode 141. The second electrode 742 and the third electrode 743 may be disposed facing each other. Each of the second electrode 742 and the third electrode 743 may have a semi-ring shape.

Hereinafter, a plasma process apparatus according to some other embodiments of the present disclosure will be explained referring to FIG. 18. Differences from the plasma process apparatus shown in FIGS. 1 to 5 will be mainly explained.

Figure 18:
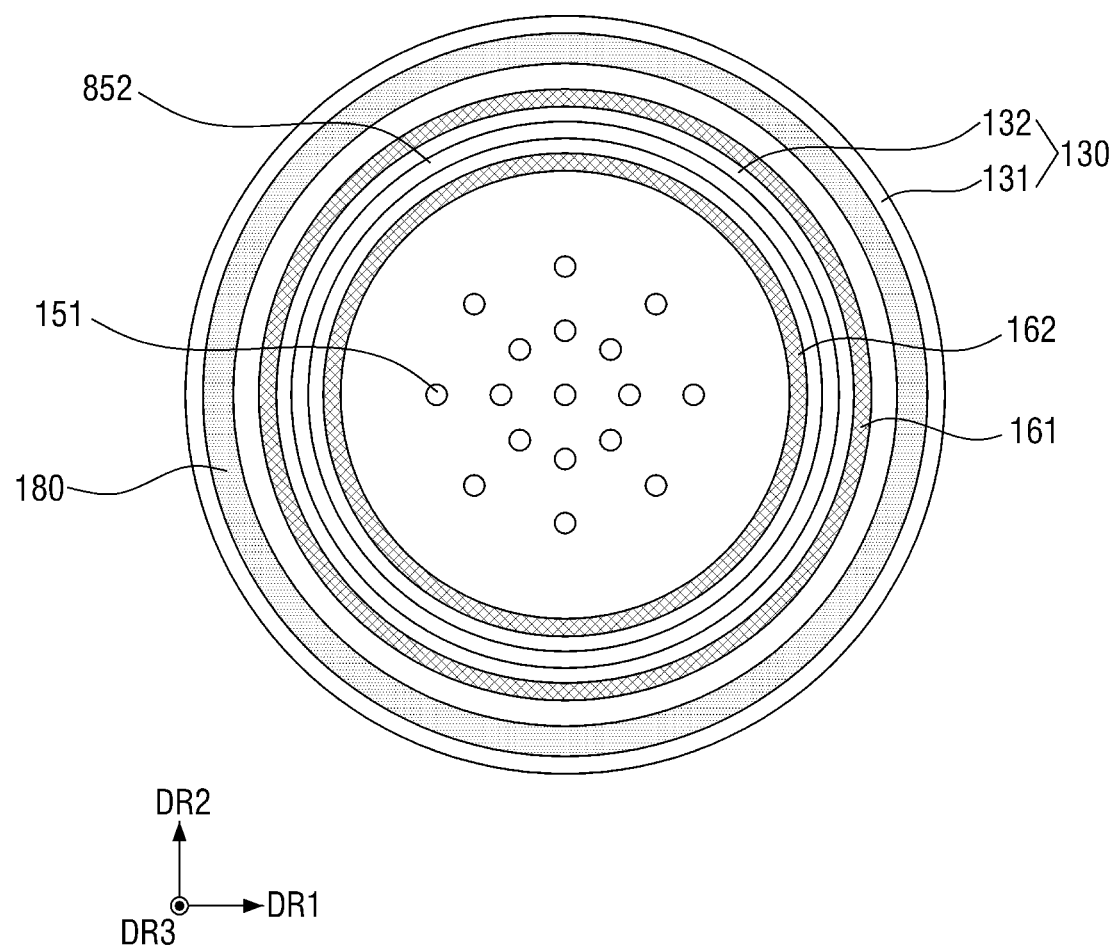
FIG. 18 is a plan view for explaining un upper part of an electrostatic chuck of a plasma process apparatus according to some other embodiments of the present disclosure.

FIG. 18 is a plan view for explaining un upper part of an electrostatic chuck of a plasma process apparatus according to some other embodiments of the present disclosure.

Referring to FIG. 18, in the plasma process apparatus according to some other embodiment of the present disclosure, a second cooling gas supply line 852 exposed on the upper surface of the second portion 132 of the electrostatic chuck 130 may have a ring shape in the plane defined by the first direction DR1 and the second direction DR2.

The upper surface of the second cooling gas supply line 852 may be formed between the first dam 161 and the second dam 162.

Hereinafter, the plasma process apparatus according to some other embodiment of the present disclosure will be explained referring to FIGS. 19 and 20. Differences from the plasma process apparatus shown in FIGS. 1 to 5 will be mainly explained.

Figure 19:
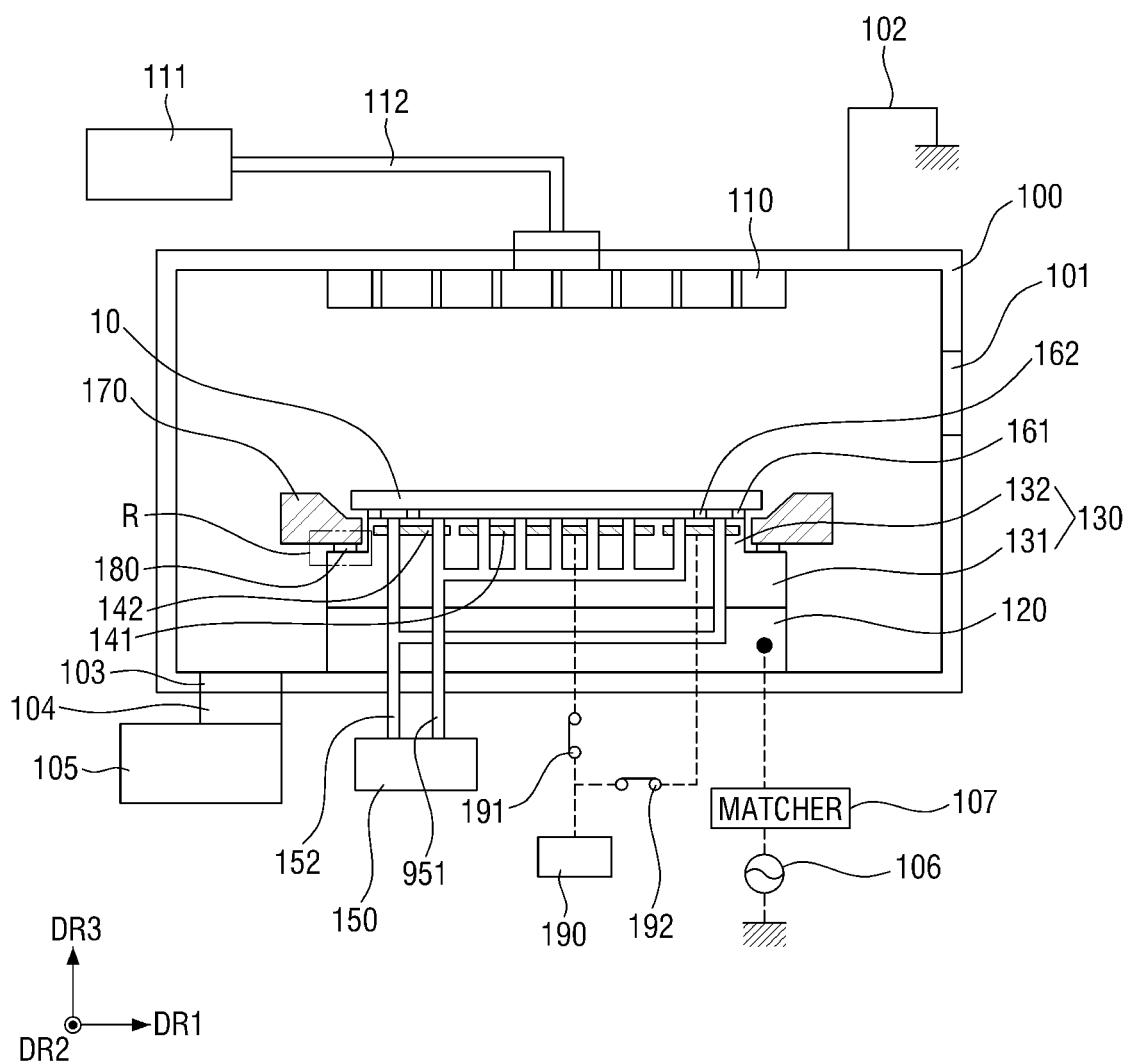
FIG. 19 is a diagram for explaining a plasma process apparatus according to some other embodiments of the present disclosure.

FIG. 19 is a diagram for explaining a plasma process apparatus according to some other embodiments of the present disclosure. FIG. 20 is a plan view for explaining an upper part of an electrostatic chuck shown in FIG. 19 according to example embodiments.

Figure 20:
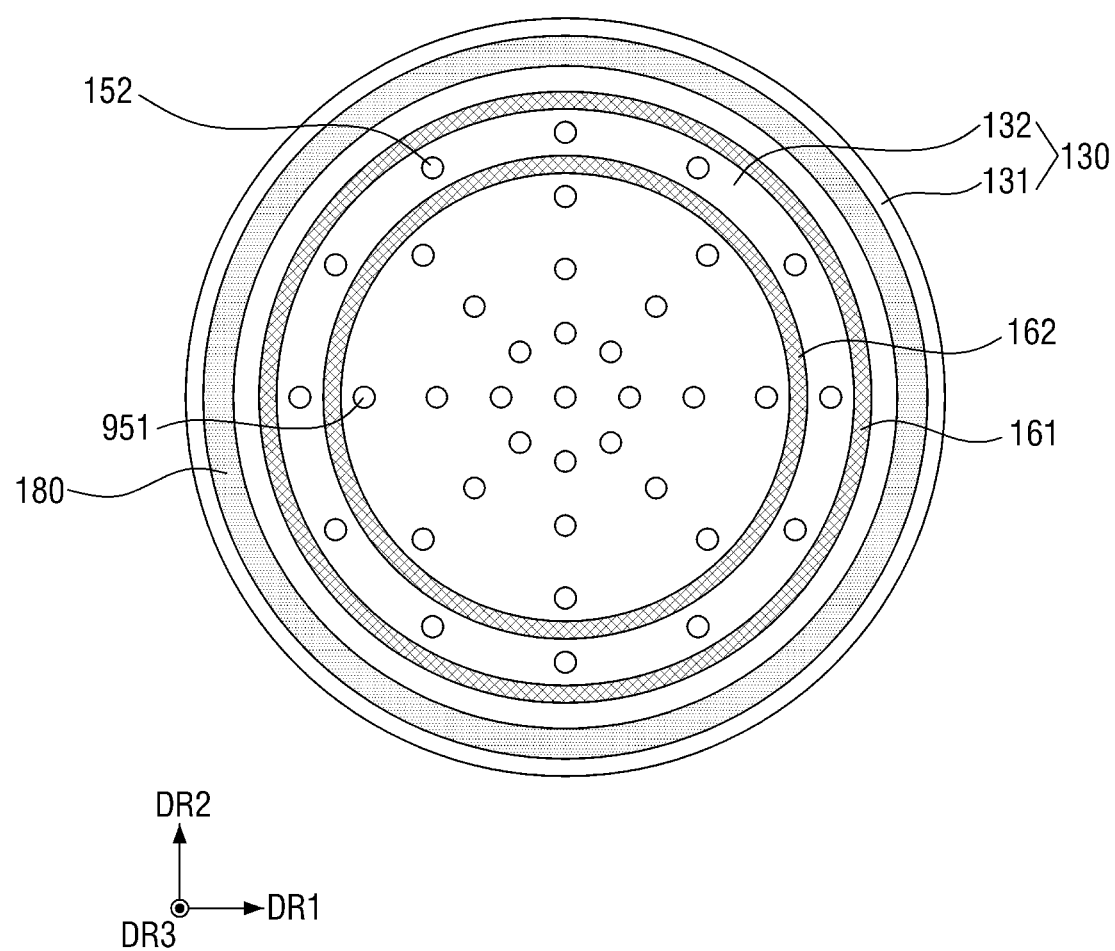
FIG. 20 is a plan view for explaining an upper part of an electrostatic chuck shown in FIG. 19 according to example embodiments.

Referring to FIGS. 19 and 20, in the plasma process apparatus according to some other embodiment of the present disclosure, at least one of the first cooling gas supply lines 951 may penetrate the second electrode 142 in the third direction DR3. For example, the first cooling gas supply line 951 may penetrate each of the first electrode 141 and the second electrode 142 in the third direction DR3.

The first cooling gas supply line 951 that penetrates the second electrode 142 in the third direction DR3 may be disposed inside the second dam 162.

Hereinafter, a plasma process apparatus according to some other embodiment of the present disclosure will be explained referring to FIGS. 21 to 23. Differences from the plasma process apparatus shown in FIGS. 1 to 5 will be mainly explained.

Figure 21:
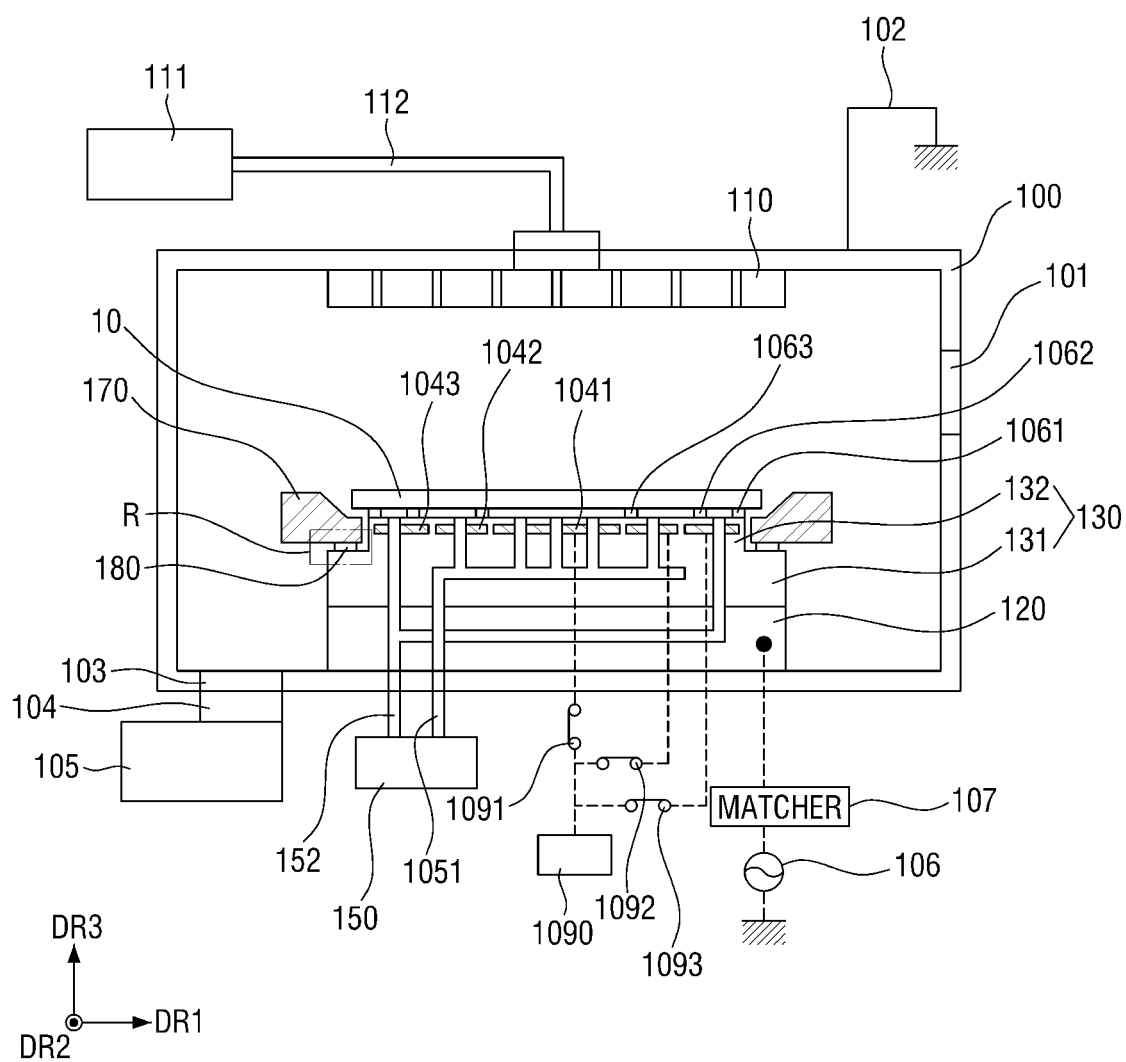
FIG. 21 is a diagram for explaining a plasma process apparatus according to some other embodiments of the present disclosure.

FIG. 21 is a diagram for explaining a plasma process apparatus according to some other embodiments of the present disclosure. FIG. 22 is a plan view for explaining first to third electrodes shown in FIG. 21 according to example embodiments. FIG. 23 is a plan view for explaining an upper part of the electrostatic chuck shown in FIG. 21 according to example embodiments.

Figure 22:
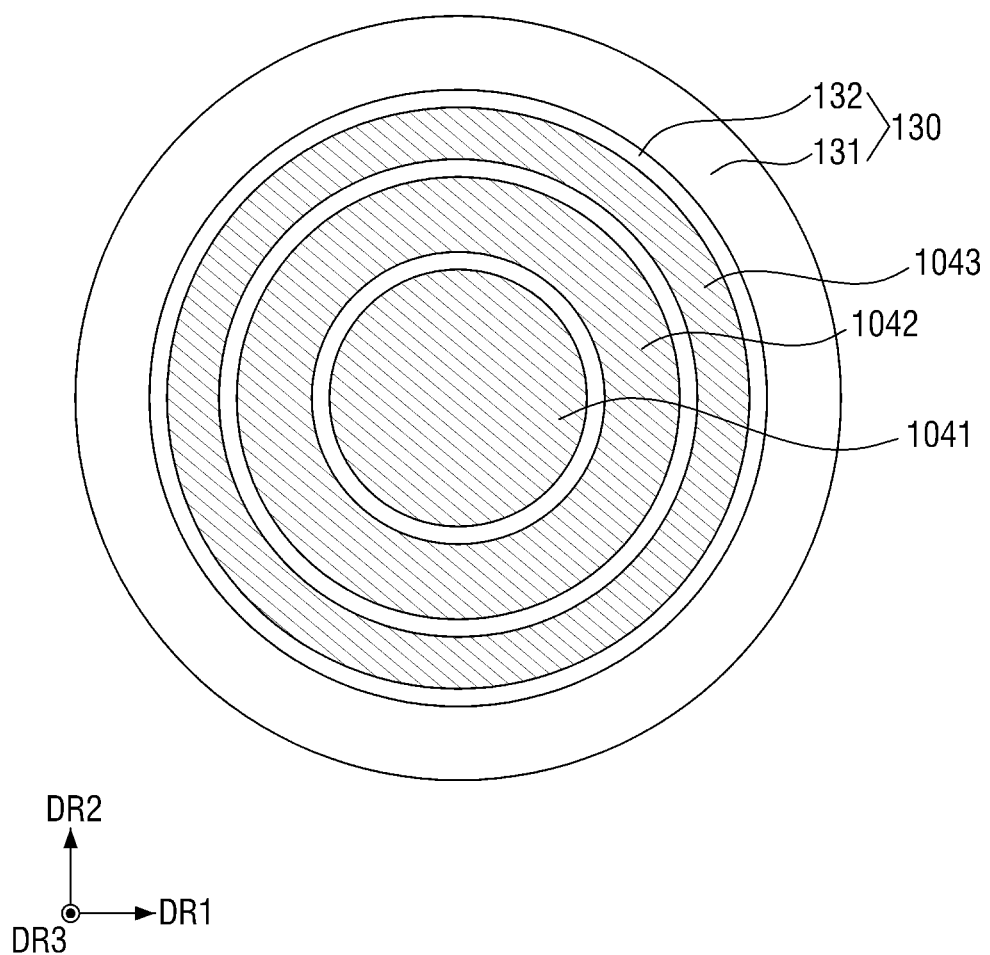
FIG. 22 is a plan view for explaining first to third electrodes shown in FIG. 21 according to example embodiments.
Figure 23:
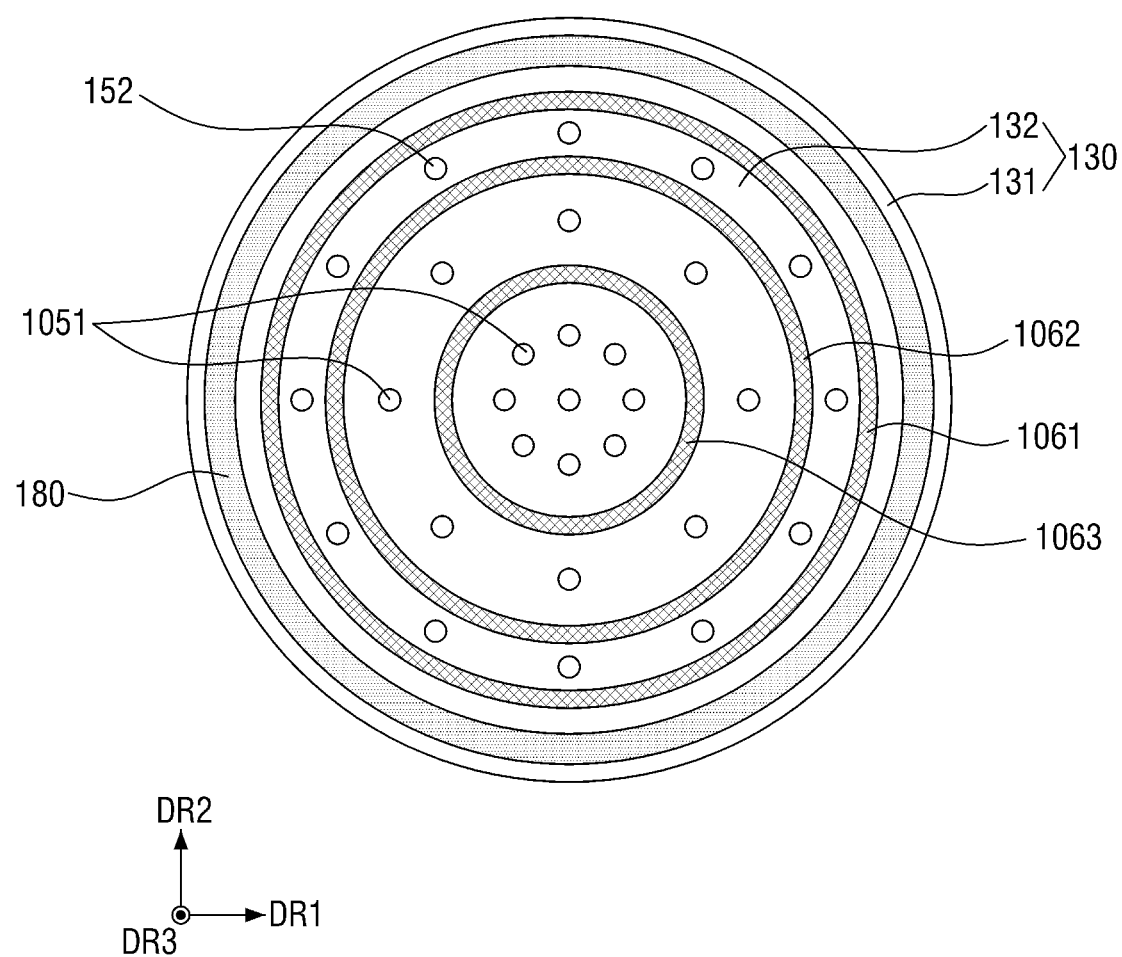
FIG. 23 is a plan view for explaining an upper part of an electrostatic chuck shown in FIG. 21 according to example embodiments.

Referring to FIGS. 21 to 23, in the plasma process apparatus according to some other embodiment of the present disclosure, a first electrode 1041, a second electrode 1042 and a third electrode 1043 may be disposed inside the second portion 132 of the electrostatic chuck 130.

The first electrode 1041, the second electrode 1042, and the third electrode 1043 may be disposed on the same plane to be spaced apart from each other. The first electrode 1041 may have a circular shape in the plane defined by the first direction DR1 and the second direction DR2. The second electrode 1042 may have a ring shape surrounding the first electrode 1041. The third electrode 1043 may have a ring shape surrounding the second electrode 1042.

A first dam 1061 may be disposed along an edge of an upper surface of the second portion 132 of the electrostatic chuck 130. A second dam 1062 may overlap the third electrode 1043 in the third direction DR3. The second dam 1062 may be disposed inside the first dam 1061. The second dam 1062 may be spaced apart from the first dam 1061. A third dam 1063 may overlap the second electrode 1042 in the third direction DR3. The third dam 1063 may be disposed inside the second dam 1062. The third dam 1063 may be spaced apart from the second dam 1062.

A first cooling gas supply line 1051 may penetrate each of the first electrode 1041 and the second electrode 1042 in the third direction DR3. An upper surface of the first cooling gas supply line 1051 penetrating the second electrode 1042 may be formed between the second dam 1062 and the third dam 1063. A second cooling gas supply line 152 may penetrate the third electrode 1043 in the third direction DR3.

A first power supply 1090 may control the voltage applied to the first electrode 1041 using a first switch 1091, control the voltage applied to the second electrode 1042 using a second switch 1092, and control the voltage applied to the third electrode 1043 using a third switch 1093.

Hereinafter, a method for dechucking a wafer in a plasma process apparatus according to some other embodiments of the present disclosure will be explained referring to FIGS. 21 and 24.

Figure 24:
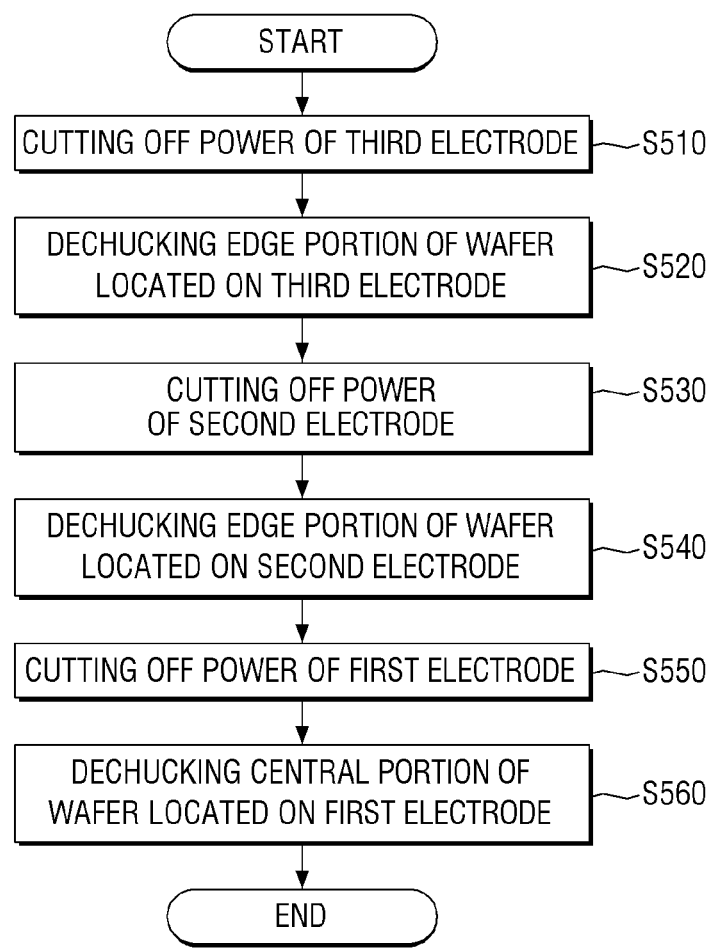
FIG. 24 is a flowchart for explaining a method for dechucking the wafer in a plasma process apparatus according to some other embodiments of the present disclosure.

FIG. 24 is a flowchart for explaining the method for dechucking the wafer in the plasma process apparatus according to some other embodiments of the present disclosure.

Referring to FIGS. 21 and 24, the power supply of the third electrode 1043 may be cut off after the plasma process on the wafer 10 is completed (S510). By cutting off the third switch 1093, the voltage applied from the first power supply 1090 to the third electrode 1043 may be cut off. Subsequently, the edge portion of the wafer 10 located on the third electrode 1043 may be dechucked (S520).

Subsequently, after dechucking the edge portion of the wafer 10 located on the third electrode 1043, the power supply of the second electrode 1042 may be cut off (S530). By cutting off the second switch 1092, the voltage applied from the first power supply 1090 to the second electrode 1042 may be cut off. Subsequently, the edge portion of the wafer 10 located on the second electrode 1042 may be dechucked (S540).

Subsequently, after dechucking the edge portion of the wafer 10 located on the second electrode 1042, the power supply of the first electrode 1041 may be cut off (S550). By cutting off the first switch 1091, the voltage applied from the first power supply 1090 to the first electrode 1041 may be cut off. Subsequently, the central portion of the wafer 10 located on the first electrode 1041 may be dechucked (S560).

While the present disclosure has been described with reference to exemplary embodiments thereof, it will be apparent to those of ordinary skill in the art that various changes and modifications may be made thereto without departing from the spirit and scope of the invention as set forth in the following claims.

What is claimed is:

1. A plasma process apparatus comprising:
a chamber in which a plasma process is performed;
an electrostatic chuck which supports a wafer inside the chamber and comprises a first portion and a second portion disposed on the first portion, a width of the first portion in a first direction being greater than a width of the second portion in the first direction;
a first electrode disposed inside the electrostatic chuck;
a second electrode which is spaced apart from the first electrode inside the electrostatic chuck, surrounds the first electrode in a plane defined by the first direction and a second direction perpendicular to the first direction, and is disposed on the same plane as the first electrode;
a power supply configured to apply a voltage to each of the first electrode and the second electrode;
a plurality of cooling gas supply lines which penetrates the electrostatic chuck in a third direction perpendicular to the first and second directions and is configured to provide a cooling gas to the wafer;
a focus ring which surrounds side walls of the second portion of the electrostatic chuck and includes a first upper horizontal surface, a second upper horizontal surface, and an upper connecting surface directly connected to the first upper horizontal surface and the second upper horizontal surface and forming an oblique angle with respect to the second upper horizontal surface; and
a junction portion disposed between the first portion of the electrostatic chuck and the focus ring,
wherein the junction portion comprises:
a first layer having a first thickness, and disposed on the first portion of the electrostatic chuck;
a second layer having a second thickness smaller than the first thickness, and disposed on the first layer and including a metal; and
a third layer having a third thickness smaller than the first thickness and the second thickness, and disposed between the focus ring and the second layer in a vertical the third direction,
wherein a material of the first layer is different from a material of the third layer,
wherein the second layer is directly attached to an upper surface of the first layer and a lower surface of the third layer, and disposed between the first layer and the third layer,
wherein the first thickness is two to five times thicker than the second thickness,
wherein the second upper horizontal surface entirely overlaps the first portion of the electrostatic chuck in the third direction and the upper connecting surface at least partially overlaps the first portion of the electrostatic chuck in the third direction, and
wherein the first layer, the second layer and the third layer overlap the first portion of the electrostatic chuck, at least a portion of the second upper horizontal surface, and at least a portion of the upper connecting surface in the third direction.

2. The plasma process apparatus of claim 1, wherein each of the first electrode and the second electrode is disposed inside the second portion of the electrostatic chuck.

3. The plasma process apparatus of claim 1, wherein the plurality of cooling gas supply lines comprises:
a first cooling gas supply line which penetrates the first electrode in the third direction, and
a second cooling gas supply line which penetrates the second electrode in the third direction.

4. The plasma process apparatus of claim 3, further comprising:
a cooling gas supply connected to supply the cooling gas to the wafer through the first cooling gas supply line and the second cooling gas supply line.

5. The plasma process apparatus of claim 3, wherein the second cooling gas supply line has a ring shape on an upper surface of the second portion of the electrostatic chuck.

6. The plasma process apparatus of claim 3, wherein the first cooling gas supply line further penetrates the second electrode in the third direction.

7. The plasma process apparatus of claim 1, further comprising:
a dam protruding from an upper surface of the second portion of the electrostatic chuck,
wherein the dam is configured for the wafer to be disposed on.

8. The plasma process apparatus of claim 7, wherein the dam comprises:
a first dam disposed along an edge of the upper surface of the second portion of the electrostatic chuck, and
a second dam which overlaps the second electrode in the third direction.

9. The plasma process apparatus of claim 8, wherein at least one of the plurality of cooling gas supply lines is configured to provide the cooling gas to the wafer between the first dam and the second dam.

10. The plasma process apparatus of claim 1, further comprising:
a third electrode which is disposed on the same plane as each of the first and second electrodes, is disposed apart from each of the first and second electrodes, and surrounds the second electrode.

11. The plasma process apparatus of claim 1, further comprising:
a third electrode disposed on the same plane as each of the first and second electrodes and disposed apart from each of the first and second electrodes,
wherein the second electrode surrounds a first side wall of the first electrode, and the third electrode surrounds a second side wall of the first electrode opposite to the first side wall.

12. The plasma process apparatus of claim 1, wherein the first thickness of the first layer in the third direction is 60 μm to 350 μm, and the second thickness of the second layer in the third direction is 30 μm to 70 μm.

13. A plasma process apparatus comprising:
a chamber in which a plasma process is performed;
an electrostatic chuck which supports a wafer inside the chamber and comprises a first portion and a second portion disposed on the first portion, a width of the first portion in a first direction being greater than a width of the second portion in the first direction;
first and second electrodes disposed apart from each other inside the second portion of the electrostatic chuck;

a focus ring which surrounds side walls of the second portion of the electrostatic chuck and includes a first upper horizontal surface, a second upper horizontal surface, and an upper connecting surface directly connected to the first upper horizontal surface and the second upper horizontal surface and forming an oblique angle with respect to the second upper horizontal surface; and a junction portion disposed between the first portion of the electrostatic chuck and the focus ring, and comprising a first layer and a second layer disposed on the first layer, the second layer including a metal; and a first bonding layer disposed between the second layer and the focus ring, wherein a first thickness of the first layer in a vertical direction is 60 μm to 350 μm, and a second thickness of the second layer in the vertical direction is 30 μm to 70 μm, wherein the first thickness is two to five times thicker than the second thickness, wherein the first bonding layer has a third thickness smaller than the first thickness and the second thickness, wherein a material of the first layer is different from a material the first bonding layer, wherein the second upper horizontal surface entirely overlaps the first portion of the electrostatic chuck in the vertical direction and the upper connecting surface at least partially overlaps the first portion of the electrostatic chuck in the vertical direction, and wherein the first layer, the second layer, and the first bonding layer overlap the first portion of the electrostatic chuck, at least a portion of the second upper horizontal surface, and at least a portion of the upper connecting surface in the vertical direction.

14. The plasma process apparatus of claim 13,
wherein the second electrode surrounds the first electrode in a plane defined by the first direction and a second direction perpendicular to the first direction, and
wherein the first electrode and the second electrode are disposed on the same plane.

15. The plasma process apparatus of claim 13, further comprising:
a second bonding layer disposed between the first layer and the second layer,
wherein the second bonding layer has a fourth thickness smaller than the first thickness of the first layer.

16. The plasma process apparatus of claim 13,
wherein the junction portion further comprises:
a third layer disposed between the second layer and the first bonding layer, and including the same material as the first layer.

17. The plasma process apparatus of claim 1, wherein the upper connecting surface is a planar surface.

18. The plasma process apparatus of claim 1, wherein the first layer, the second layer, and the third layer do not overlap the first upper horizontal surface in the third direction.

19. The plasma process apparatus of claim 13, wherein the upper connecting surface is a planar surface.

20. The plasma process apparatus of claim 13, wherein the first layer, the second layer, and the first bonding layer do not overlap the first upper horizontal surface in the vertical direction.

* * * * *